US008553476B2

(12) United States Patent
Yan et al.

(10) Patent No.: US 8,553,476 B2
(45) Date of Patent: Oct. 8, 2013

(54) THREE DIMENSIONAL MEMORY SYSTEM WITH PAGE OF DATA ACROSS WORD LINES

(75) Inventors: Tianhong Yan, San Jose, CA (US); Luca G. Fasoli, Campbell, CA (US); Roy E. Scheuerlein, Cupertino, CA (US)

(73) Assignee: SanDisk 3D LLC, Milpitas, CA (US)

( * ) Notice: Subject to any disclaimer, the term of this patent is extended or adjusted under 35 U.S.C. 154(b) by 447 days.

(21) Appl. No.: 13/039,581

(22) Filed: Mar. 3, 2011

(65) Prior Publication Data
US 2012/0224409 A1 Sep. 6, 2012

(51) Int. Cl.
*G11C 7/00* (2006.01)
(52) U.S. Cl.
USPC ............. 365/189.16; 365/230.03; 365/230.06
(58) Field of Classification Search
USPC ..................... 365/189.16, 230.03, 230.06
See application file for complete search history.

(56) References Cited

U.S. PATENT DOCUMENTS

| | | |
|---|---|---|
| 4,527,254 A | 7/1985 | Ryan |
| 4,593,390 A | 6/1986 | Hildebrand |
| 5,289,413 A | 2/1994 | Tsuchida |
| 5,424,997 A | 6/1995 | Rapp |
| 5,541,869 A | 7/1996 | Rose |
| 5,592,435 A | 1/1997 | Mills |
| 5,784,705 A | 7/1998 | Leung |
| 5,901,086 A | 5/1999 | Wang |
| 5,915,167 A | 6/1999 | Leedy |
| 5,969,986 A | 10/1999 | Wong |
| 6,034,882 A | 3/2000 | Johnson |
| 6,072,716 A | 6/2000 | Jacobson |
| 6,134,145 A | 10/2000 | Wong |
| 6,420,215 B1 | 7/2002 | Knall |
| 6,473,332 B1 | 10/2002 | Ignatiev |
| 6,525,953 B1 | 2/2003 | Johnson |
| 6,661,730 B1 | 12/2003 | Scheuerlein |
| 6,737,675 B2 | 5/2004 | Patel |
| 6,856,572 B2 | 2/2005 | Scheuerlein |
| 6,879,505 B2 | 4/2005 | Scheuerlein |
| 6,888,750 B2 | 5/2005 | Walker |
| 6,951,780 B1 | 10/2005 | Herner |
| 6,952,030 B2 | 10/2005 | Herner |
| 6,952,043 B2 | 10/2005 | Vyvoda |
| 7,002,825 B2 | 2/2006 | Scheuerlein |
| 7,081,377 B2 | 7/2006 | Cleeves |
| 7,106,652 B2 | 9/2006 | Scheuerlein |

(Continued)

OTHER PUBLICATIONS

PCT International Search Report dated May 11, 2012, PCT Patent Application PCT/US2012/025171.

(Continued)

*Primary Examiner* — Tuan T. Nguyen
(74) *Attorney, Agent, or Firm* — Vierra Magen Marcus LLP

(57) ABSTRACT

A three dimensional monolithic memory array of non-volatile storage elements includes a plurality of word lines and a plurality of bit lines. The plurality of bit lines are grouped into columns. One page of data is stored across multiple word lines by programming non-volatile storage elements connected to one column of bit lines and multiple word lines while maintaining the selection of the one column of bit lines. In one embodiment, programming non-volatile storage elements includes selectively connecting bit lines to sense amplifiers using selection circuits that include a storage device, a select circuit connected to the storage device and one or more level shifters providing two or more interfaces to the respective selection circuit.

20 Claims, 16 Drawing Sheets

(56) References Cited

U.S. PATENT DOCUMENTS

| | | |
|---|---|---|
| 7,176,064 B2 | 2/2007 | Herner |
| 7,177,169 B2 | 2/2007 | Scheuerlein |
| 7,243,203 B2 | 7/2007 | Scheuerlein |
| 7,254,690 B2 | 8/2007 | Rao |
| 7,272,052 B2 | 9/2007 | Scheuerlein |
| 7,286,439 B2 | 10/2007 | Fasoli |
| 7,298,665 B2 | 11/2007 | So |
| 7,359,279 B2 | 4/2008 | Fasoli |
| 7,383,476 B2 | 6/2008 | Crowley |
| 7,542,338 B2 | 6/2009 | Scheuerlein |
| 7,570,523 B2 | 8/2009 | Scheuerlein |
| 7,633,828 B2 | 12/2009 | Scheuerlein |
| 7,684,245 B2 | 3/2010 | Schumann |
| 7,745,265 B2 | 6/2010 | Mokhlesi |
| 7,808,038 B2 | 10/2010 | Mokhlesi |
| 7,851,851 B2 | 12/2010 | Mokhlesi |
| 7,869,258 B2 | 1/2011 | Scheuerlein |
| 2003/0045054 A1 | 3/2003 | Campbell |
| 2003/0047765 A1 | 3/2003 | Campbell |
| 2004/0027856 A1* | 2/2004 | Lee et al. .................. 365/185.11 |
| 2005/0185501 A1* | 8/2005 | Lee et al. .................... 365/238.5 |
| 2006/0087005 A1 | 4/2006 | Herner |
| 2006/0250836 A1 | 11/2006 | Herner |
| 2007/0008785 A1 | 1/2007 | Scheuerlein |
| 2007/0072360 A1 | 3/2007 | Kumar |
| 2007/0190722 A1 | 8/2007 | Herner |
| 2008/0010429 A1 | 1/2008 | Rao |
| 2008/0159053 A1 | 7/2008 | Yan |
| 2009/0001343 A1 | 1/2009 | Schricker |
| 2009/0323391 A1 | 12/2009 | Scheuerlein |
| 2009/0323393 A1 | 12/2009 | Scheuerlein |
| 2010/0046267 A1 | 2/2010 | Yan |
| 2010/0085822 A1 | 4/2010 | Yan |
| 2010/0246250 A1 | 9/2010 | Chen |
| 2010/0265750 A1 | 10/2010 | Yan |
| 2010/0290286 A1 | 11/2010 | Koya |
| 2011/0141788 A1* | 6/2011 | Balakrishnan et al. ......... 365/51 |
| 2011/0141832 A1* | 6/2011 | Balakrishnan et al. .. 365/189.16 |

OTHER PUBLICATIONS

PCT Written Opinion of the International Searching Authority dated May 11, 2012, PCT Patent Application PCT/US2012/025171.

Notice of Allowance dated Nov. 29, 2012, U.S. Appl. No. 13/039,574.

U.S. Appl. No. 13/039,593, filed Mar. 3, 2011.

U.S. Appl. No. 13/039,574, filed Mar. 3, 2011.

* cited by examiner

THREE DIMENSIONAL MEMORY SYSTEM WITH PAGE OF DATA ACROSS WORD LINES

BACKGROUND

1. Field

The present invention relates to technology for data storage.

2. Description of the Related Art

Semiconductor memory has become more popular for use in various electronic devices. For example, non-volatile semiconductor memory is used in cellular telephones, digital cameras, personal digital assistants, mobile computing devices, non-mobile computing devices and other devices. When semiconductor memory is used in consumer electronic devices, consumers generally want the semiconductor memory to perform at sufficient speeds so that the memory does not slow down operation of the electronic device. Additionally, it is desirable to increase the density of storage in a memory while minimizing space used for peripheral circuitry.

BRIEF DESCRIPTION OF THE DRAWINGS

FIG. 9 is a schematic diagram of one embodiment of a selection circuit.

DETAILED DESCRIPTION

A three dimensional monolithic memory array of non-volatile storage elements includes a plurality of word lines and a plurality of bit lines. The plurality of bit lines are grouped into columns. The memory system stores one page of data across multiple word lines programming by selecting one column of the bit lines using multi-block column decoders and programming non-volatile storage elements connected to the bit lines of the selected column and multiple word lines. By not changing the column address during the programming process, programming speed is increase. Some prior designs include changing column addresses during programming, which delays the programming because in some designs the column address cannot be changed until the bit lines are discharged. Also, by not needing to change the column address, global column decoders for multiple blocks can be used, which saves space on the semiconductor die. In various embodiments, non-volatile storage elements (also called memory cells) on different word lines can be programmed sequentially or simultaneously.

In one embodiment, programming non-volatile storage elements includes selectively connecting bit lines to sense amplifiers using selection circuits that include a storage device, a select circuit connected to the storage device and one or more level shifters providing two or more interfaces to the respective selection circuit. By using such selection circuits, programming cycles can be pipelined, which increases programming speed.

Figure 1:
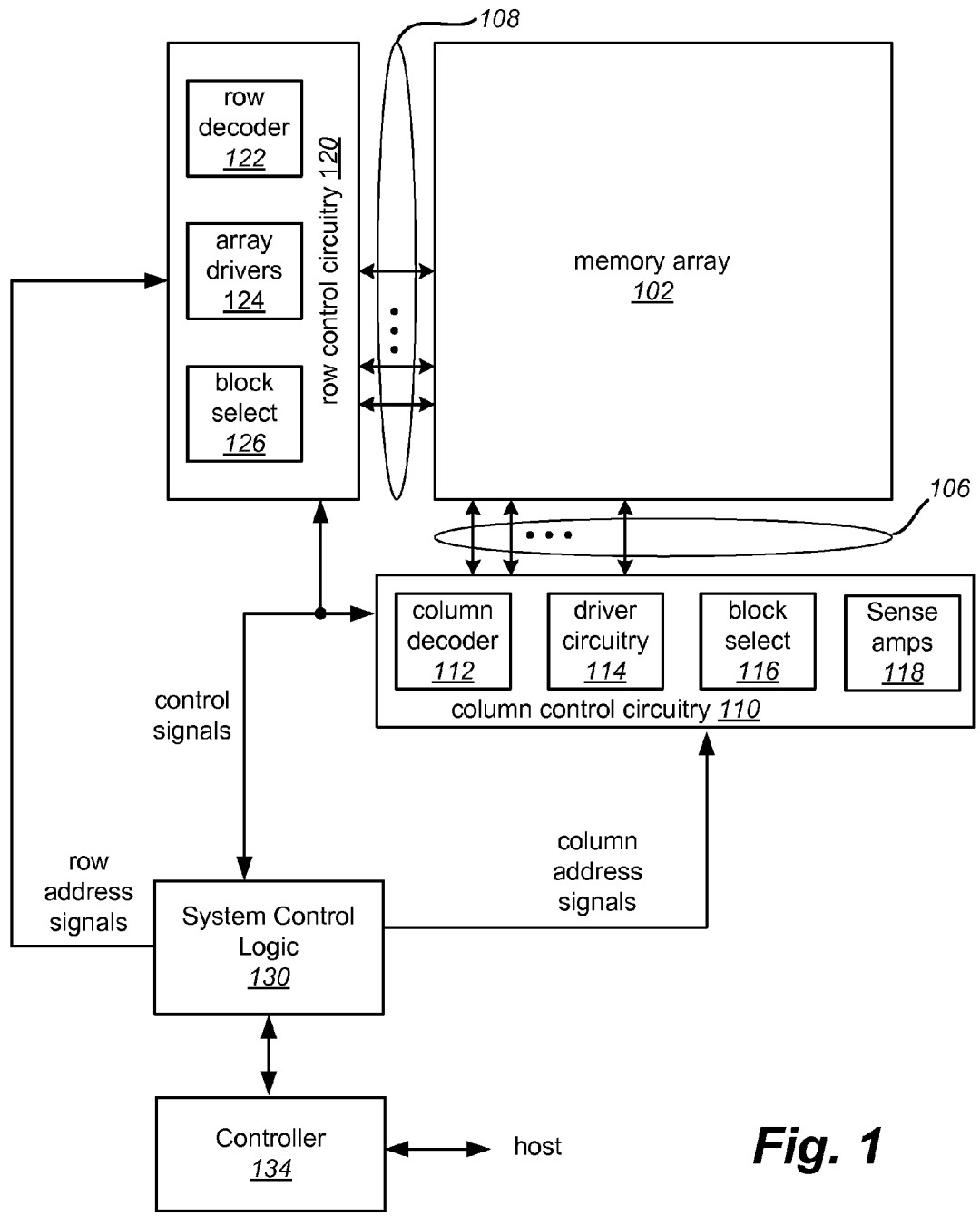
FIG. 1 is a block diagram of one embodiment of a memory system.

FIG. 1 is a block diagram that depicts one example of a memory system 100 that can implement the technology described herein. Memory system 100 includes a memory array 102, which can be a two or three dimensional array of memory cells. In one embodiment, memory array 102 is a monolithic three dimensional memory array. The array terminal lines of memory array 102 include the various layer(s) of word lines organized as rows, and the various layer(s) of bit lines organized as columns. However, other orientations can also be implemented.

A monolithic three dimensional memory array is one in which multiple memory levels are formed above a single substrate, such as a wafer, with no intervening substrates. The layers forming one memory level are deposited or grown directly over the layers of an existing level or levels. In contrast, stacked memories have been constructed by forming memory levels on separate substrates and adhering the memory levels atop each other, as in Leedy, U.S. Pat. No. 5,915,167, "Three Dimensional Structure Memory." The substrates may be thinned or removed from the memory levels before bonding, but as the memory levels are initially formed over separate substrates, such memories are not true monolithic three dimensional memory arrays.

Memory system 100 includes row control circuitry 120, whose outputs 108 are connected to respective word lines of the memory array 102. For purposes of this document, a connection can be a direct connection or indirect connection (e.g., via one or more other components). Row control circuitry 120 receives a group of M row address signals and one or more various control signals from System Control Logic circuit 130, and typically may include such circuits as row decoders 122, array drivers 124, and block select circuitry 126 for both read and programming operations.

Memory system 100 also includes column control circuitry 110 whose input/outputs 106 are connected to respective bit lines of the memory array 102. Column control circuitry 110 receives a group of N column address signals and one or more various control signals from System Control Logic 130, and typically may include such circuits as column decoders 112, driver circuitry 114, block select circuitry 116, and sense amplifiers 118. In one embodiment, sense amplifiers 118 provide signals to the bit lines and sense signals on the bit lines. Various sense amplifiers known in the art can be used herein.

System control logic 130 receives data and commands from controller 134 and provides output data to controller 134. Controller 134 communicates with a host. System control logic 130 may include one or more state machines, registers and other control logic for controlling the operation of memory system 100. In other embodiments, system control logic 130 receives data and commands directly from a host and provides output data to that host, because system control logic 130 includes the functionality of a controller.

In one embodiment, system control logic 130, column control circuitry 110, row control circuitry 120 and memory array 102 are formed on the same integrated circuit. For example, system control logic 130, column control circuitry 110 and row control circuitry 120 can be formed on the surface of a substrate and memory array 102 is a monolithic three-dimensional memory array formed above the substrate (and, therefore, above all or a portion of system control logic 130, column control circuitry 110 and row control circuitry 120). In some cases, a portion of the control circuitry can be formed on the same layers as some of the memory array. More information about suitable embodiments like that of FIG. 1 can be found in the following United States patents that are incorporated herein by reference in their entirety: U.S. Pat. No. 6,879,505; U.S. Pat. No. 7,286,439; U.S. Pat. No. 6,856,572; and U.S. Pat. No. 7,359,279. Controller 134 can be on the same substrate as or a different substrate than the other components depicted in FIG. 1. Controller 134, system control logic 130, column control circuitry 110, column decoder 112, driver circuitry 114, block select 116, sense amplifiers 118, row control circuitry 120, row decoder 122, array drivers 124 and/or block select 126, alone or in any combination, can be thought of as one or more control circuits.

Memory array 102 includes a plurality of memory cells. In one embodiment, each memory cell includes a steering element (e.g., a diode) and a resistance element. In one example implementation, the memory cells may be such that they can be programmed once and read many times. One example memory cell includes a pillar of layers formed at the intersection between the upper and lower conductors. In one embodiment, the pillar includes a steering element, such as a diode, that is connected in series with a state change element, such as an antifuse layer. When the antifuse layer is intact, the cell is electrically an open circuit. When the antifuse layer is breached, the cell is electrically a diode in series with the resistance of the breached antifuse layer. Examples of memory cells can be found in U.S. Pat. No. 6,034,882; U.S. Pat. No. 6,525,953; U.S. Pat. No. 6,952,043; U.S. Pat. No. 6,420,215; U.S. Pat. No. 6,951,780; and U.S. Pat. No. 7,081,377.

In another embodiment, memory cells are re-writable. For example, U.S. Patent Application Publication No. 2006/0250836, which is incorporated herein by reference in its entirety, describes a rewriteable non-volatile memory cell that includes a diode coupled in series with a reversible resistance-switching element. A reversible resistance-switching element includes reversible resistance-switching material having a resistance that may be reversibly switched between two or more states. For example, the reversible resistance-switching material may be in an initial high-resistance state upon fabrication that is switchable to a low-resistance state upon application of a first voltage and/or current. Application of a second voltage and/or current may return the reversible resistance-switching material to the high-resistance state. Alternatively, the reversible resistance-switching element may be in an initial low-resistance state upon fabrication that is reversibly switchable to a high-resistance state upon application of the appropriate voltage(s) and/or current(s). One resistance state may represent a binary "0" while another resistance state may represent a binary "1." More than two data/resistance states may be used so that the memory cell stores two or more bits of data. In one embodiment, the process of switching the resistance from the high-resistance state to the low-resistance state is referred to as a SET operation. The process of switching the resistance from the low-resistance state to the high-resistance state is referred to as a RESET operation. The high-resistance state is associated with binary data "0" and the low-resistance state is associated with binary data "1." In other embodiments, SET and RESET and/or the data encoding can be reversed. In some embodiments, the first time a resistance-switching element is SET requires a higher than normal voltage and is referred to as a FORMING operation.

Figure 2:
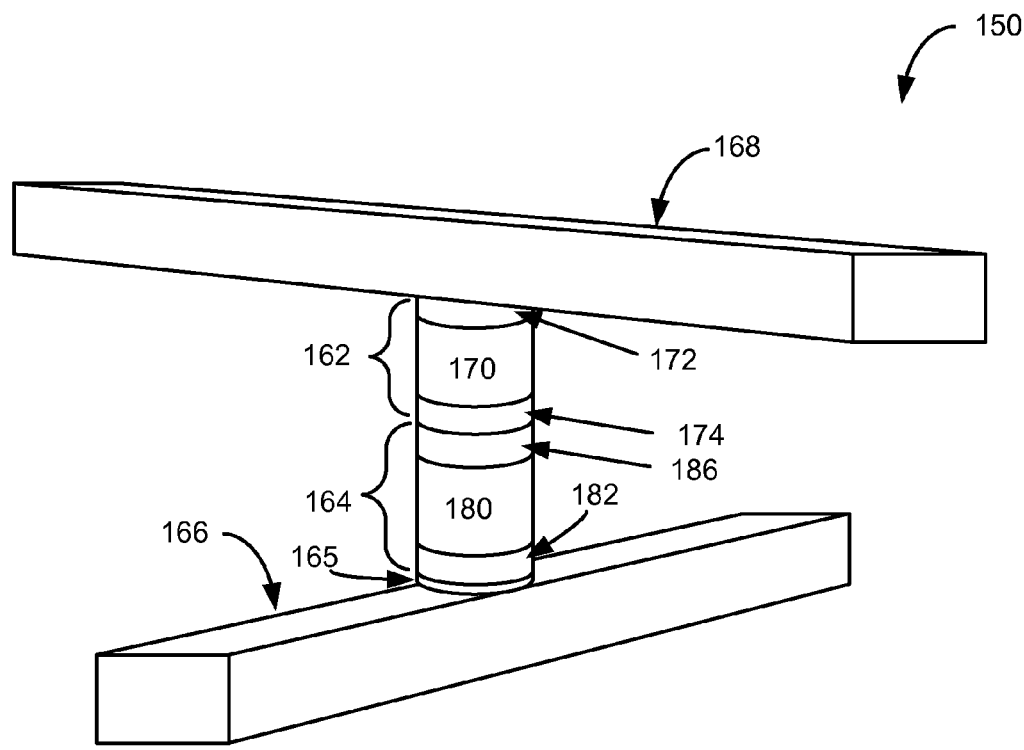
FIG. 2 is a simplified perspective view of one embodiment of a memory cell.

FIG. 2 is a simplified perspective view of one example of a memory cell 150 that includes reversible resistance-switching element 162, steering element 164 and barrier 165 coupled in series and positioned between a first conductor 166 and a second conductor 168.

Reversible resistance-switching element 162 includes reversible resistance-switching material 170 having a resistance that may be reversibly switched between two or more states. In some embodiments, reversible resistance-switching material 170 may be formed from a metal oxide. Various different metal oxides can be used. In one example, nickel oxide is be used.

In at least one embodiment, through use of a selective deposition process, a nickel oxide layer may be used in a reversible resistance-switching material without the nickel oxide layer being etched. For example, a reversible resistance-switching element may be formed by employing a deposition process such as electroplating, electroless deposition, or the like, to selectively deposit a nickel-containing layer only on conductive surfaces formed above a substrate. In this manner, only the conductive surfaces on the substrate are patterned and/or etched (prior to deposition of the nickel-containing layer) and not the nickel-containing layer.

In at least one embodiment, the reversible resistance-switching material 170 includes at least a portion of a nickel oxide layer formed by selectively depositing nickel and then oxidizing the nickel layer. For example, Ni, $Ni_xP_y$ or another similar form of nickel may be selectively deposited using electroless deposition, electroplating or a similar selective process, and then oxidized to form nickel oxide (e.g., using rapid thermal oxidation or another oxidation process). In other embodiments, nickel oxide itself may be selectively deposited. For example, an NiO-, $NiO_x$- or $NiO_xP_y$-containing layer may be selectively deposited above the steering element using a selective deposition process and then annealed and/or oxidized (if necessary).

Other materials may be selectively deposited, and then annealed and/or oxidized if necessary, to form reversible resistance-switching materials for use in memory cells. For example, a layer of Nb, Ta, V, Al, Ti, Co, cobalt-nickel alloy, etc., may be selectively deposited, such as by electroplating, and oxidized to form a reversible resistance-switching material.

Another variable resistance material is amorphous silicon doped with V, Co, Ni, Pd, Fe or Mn, for example as described more fully in Rose et al., U.S. Pat. No. 5,541,869. Another class of material is taught by Ignatiev et al. in U.S. Pat. No. 6,473,332: these are perovskite materials such as $Pr_{1-X}Ca_XMnO_3$ (PCMO), $La_{1-X}Ca_XMnO_3$ (LCMO), $LaSrMnO_3$ (LSMO), or GdBaCo$_X$O$_Y$ (GBCO). Another option for this variable-resistance material is a carbon-polymer film comprising carbon black particulates or graphite, for example, mixed into a plastic polymer, as taught by Jacobson et al. in U.S. Pat. No. 6,072,716. Another example is to use carbon nanotubes as a reversible resistance-switching materials.

Another material is taught by Campbell et al. in U.S. Patent Application 2003/0045054, and by Campbell in U.S. Patent Application 2003/0047765. This material is doped chalcogenide glass of the formula A$_x$B$_y$, where A includes at least one element from Group IIIA (B, Al, Ga, In, Ti), Group WA (C, Si, Ge, Sn, Pb), Group VA (N, P, As, Sb, Bi), or Group VIIA (F, Cl, Br, I, At) of the periodic table, where B is selected from among S, Se and Te and mixtures thereof. The dopant is selected from among the noble metals and transition metals, including Ag, Au, Pt, Cu, Cd, Ir, Ru, Co, Cr, Mn or Ni. This chalcogenide glass (amorphous chalcogenide, not in as crystalline state) is formed in a memory cell adjacent to a reservoir of mobile metal ions. Some other solid electrolyte material could substitute for chalcogenide glass. Other variable resistance material includes amorphous carbon, graphite and carbon nanotubes. Other materials can also be used with the technology described herein.

More information about fabricating a memory cell using reversible resistance-switching material can be found in United States Patent Application Publication 2009/0001343, "Memory Cell That Employs A Selectively Deposited Reversible Resistance Switching Element and Methods of Forming The Same," incorporated herein by reference in its entirety. Additional information can also be found in United States Patent Application Publication No. 2009/0323391, "Reverse Set With Current Limit for Non-Volatile Storage," filed on Dec. 19, 2008, incorporated herein by reference in its entirety.

Reversible resistance-switching element 162 includes electrodes 172 and 174. Electrode 172 is positioned between reversible resistance-switching material 170 and conductor 168. In one embodiment, electrode 172 is made of platinum. Electrode 174 is positioned between reversible resistance-switching material 170 and steering element 164. In one embodiment, electrode 174 is made of Titanium Nitride, and serves as a barrier layer.

Steering element 164 can be a diode, or other suitable steering element that exhibits non-ohmic conduction by selectively limiting the voltage across and/or the current flow through the reversible resistance-switching element 162. In this manner, the memory cell 150 may be used as part of a two or three dimensional memory array and data may be written to and/or read from the memory cell 150 without affecting the state of other memory cells in the array. Steering element 164 may include any suitable diode such as a vertical polycrystalline p-n or p-i-n diode, whether upward pointing with an n-region above a p-region of the diode or downward pointing with a p-region above an n-region of the diode.

In some embodiments, steering element 164 may be a diode formed from a polycrystalline semiconductor material such as polysilicon, a polycrystalline silicon-germanium alloy, polygermanium or any other suitable material. For example, the steering element 164 can be a diode that includes a heavily doped n+ polysilicon region 182, a lightly doped or an intrinsic (unintentionally doped) polysilicon region 180 above the n+ polysilicon region 182, and a heavily doped p+ polysilicon region 186 above the intrinsic region 180. In some embodiments, a thin (e.g., a few hundred angstroms or less) germanium and/or silicon-germanium alloy layer (not shown), with about 10% or more of germanium when using a silicon-germanium alloy layer, may be formed on the n+ polysilicon region 182 to prevent and/or reduce dopant migration from the n+ polysilicon region 182 into the intrinsic region 180, as described, for example, in U.S. Patent Application Publication No. 2006/0087005, filed Dec. 9, 2005 and titled "DEPOSITED SEMICONDUCTOR STRUCTURE TO MINIMIZE N-TYPE DOPANT DIFFUSION AND METHOD OF MAKING," which is hereby incorporated by reference herein in its entirety. It will be understood that the locations of the n+ and p+ regions may be reversed. When steering element 164 is fabricated from deposited silicon (e.g., amorphous or polycrystalline), one embodiment may include a silicide layer being formed on the diode to place the deposited silicon in a low resistance state.

As described in U.S. Pat. No. 7,176,064, "Memory Cell Comprising a Semiconductor Junction Diode Crystallized Adjacent to a Silicide," which is hereby incorporated by reference herein in its entirety, silicide-forming materials such as titanium and/or cobalt react with deposited silicon during annealing to form a silicide layer. The lattice spacing of titanium silicide and cobalt silicide are close to that of silicon, and it appears that such silicide layers may serve as "crystallization templates" or "seeds" for adjacent deposited silicon as the deposited silicon crystallizes (e.g., the silicide layer enhances the crystalline structure of the silicon diode during annealing). Lower resistance silicon thereby is provided. Similar results may be achieved for silicon-germanium alloy and/or germanium diodes.

Conductors 166 and 168 include any suitable conductive material such as tungsten, any appropriate metal, heavily doped semiconductor material, a conductive silicide, a conductive silicide-germanide, a conductive germanide, or the like. In the embodiment of FIG. 2, conductors 166 and 168 are rail-shaped and extend in different directions (e.g., substantially perpendicular to one another). Other conductor shapes and/or configurations may be used. In some embodiments, barrier layers, adhesion layers, antireflection coatings and/or the like (not shown) may be used with conductors 166 and 168 to improve device performance and/or aid in device fabrication.

Although the reversible resistance-switching element 162 is shown as being positioned above the steering element 164 in FIG. 2, it will be understood that in alternative embodiments, the reversible resistance-switching element 162 may be positioned below the steering element 164.

While FIG. 2 shows one example of a memory cell, no one particular type or structure of a memory cell is required for the technology disclosed herein. Many different types of memory cells can be used.

Figure 3:
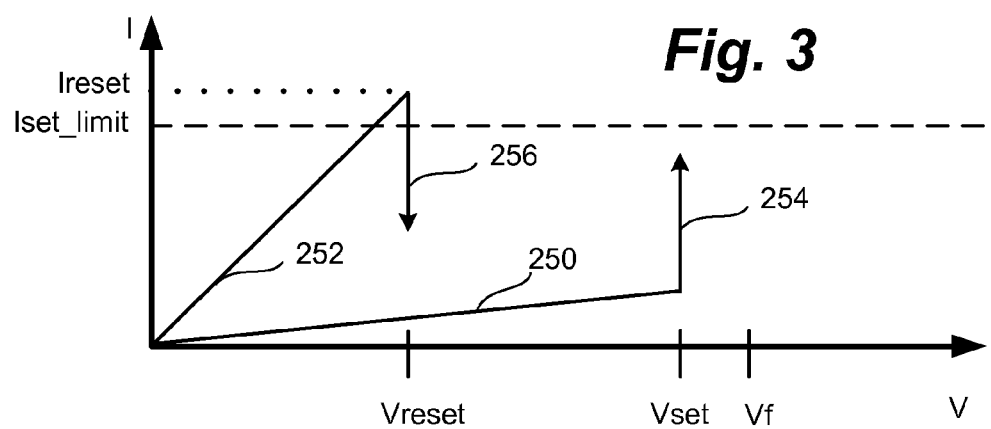
FIG. 3 is a graph depicting I-V characteristics of a reversible resistance-switching element.

FIG. 3 is a graph of voltage versus current for one example embodiment of a metal oxide reversible resistance-switching element. Line 250 represents the I-V characteristics of the reversible resistance-switching element when in the high-resistance state. Line 252 represents the I-V characteristics of the reversible resistance-switching element when in the low-resistance state. To determine which state the reversible resistance-switching element is in, a voltage is applied and the resulting current is measured. A higher measured current (see line 252) indicates that the reversible resistance-switching element is in the low-resistance state. A lower measured current (see line 250) indicates that the reversible resistance-switching element is in the high-resistance state. Note that other variations of a reversible resistance-switching element having different I-V characteristics can also be used with the technology herein.

While in the high-resistance state (see line 250), if the voltage Vset and sufficient current is applied to the memory cell, the reversible resistance-switching element will be SET to the low-resistance state. Line 254 shows the behavior when VSET is applied. The voltage will remain somewhat constant and the current will increase toward Iset_limit. At some point, the reversible resistance-switching element will be SET and the device behavior will be based on line 252. Note that the first time the reversible resistance-switching element is SET, Vf (the forming voltage) is needed to SET the device. After that, VSET can be used. The forming voltage Vf may be greater than VSET.

While in the low-resistance state (see line 252), if the voltage VRESET and sufficient current (Ireset) is applied to the memory cell, the reversible resistance-switching element will be RESET to the high-resistance state. Line 256 shows the behavior when VRESET is applied. At some point, the reversible resistance-switching element will be RESET and the device behavior will be based on line 250.

In one embodiment, Vset is approximately 5 volts, Vreset is approximately 3 volts, Iset_limit is approximately 5 uA and the Ireset current could be as high as 30 uA. In some embodiments, Vset can be lower than Vreset, the forming operation is not needed and/or the time needed to SET or RESET could be different.

The programming operations to SET and RESET the resistance of reversible resistance-switching material are known in the art. Many different implementations of circuits to SET and RESET the resistance of reversible resistance-switching material are known and can be used with the technology described herein. Examples of SET and RESET can be found in United States Patent Application 2009/0323391, "Reverse Set With Current Limit for Non-Volatile Storage," filed on Dec. 19, 2008, incorporated herein by reference in its entirety; United States Patent Application 2007/0072360, incorporated herein by reference in its entirety; and United States Patent Application 2007/0008785, incorporated herein by reference in its entirety.

In some embodiments, circuits that provide, control and/or limit the current through a memory cell can be far away from the memory cell. This distance can be more of an issue for a monolithic three dimensional memory array where the control circuitry is on the substrate surface and the memory cells are on upper layers of the three dimensional memory array (as described above). Because of this distance, the conductive paths can get quite long which results in relatively large capacitances for the lines. In some cases, after a memory cell is SET, the capacitive charge on the lines will subsequently dissipate through the memory cell, which can cause extra current to pass through the reversible resistance-switching element. This extra current may cause the reversible resistance-switching element to SET to such a low resistance value that it is difficult or impossible to RESET the element. One proposed solution is to discharge the bit line and data bus during the SET operation so that after the SET have been achieved, no unwanted current will subsequently be driven through the memory cell. In this embodiment, the diode will be forward biased during the SET operation and Vset will be applied to the memory cell as a pulse (or other form). The Vset pulse will be shorter than the time needed to SET the reversible resistance-switching element so that the charge from the bit line and data bus will be needed to provide the extra charge not provided by the Vset pulse. For example, a voltage pulse will be used to charge the bit line connected to a memory cell. Due to its parasitic capacitance, the bit line will hold a charge. After being charged up, the bit line will be cut off from the voltage source so that the bit line is floating. The charge on the bit line will then dissipate through the memory cell to the word lines, causing the memory cell to SET. One example of the capacitive discharge method can be found in United States Patent Application 2009/0323393, "Capacitive Discharge Method For Writing To Non-Volatile Memory," filed on Dec. 19, 2008, incorporated herein by reference in its entirety.

In some implementations, the SET operation can be followed by a verify operation to see if the SET operation was successful. If not, the SET operation can be retried. In one example implementation, the verify operation is a read operation. Therefore, system control logic 130 will first cause one or more memory cells to be programmed (SET or RESET) and will then read all of the memory cells programmed. If the data read matches the data to be programmed, then the process is complete. If some of the data read does not match the data programmed (most likely because the programming was not successful), then the programming is repeated.

Figure 4A:
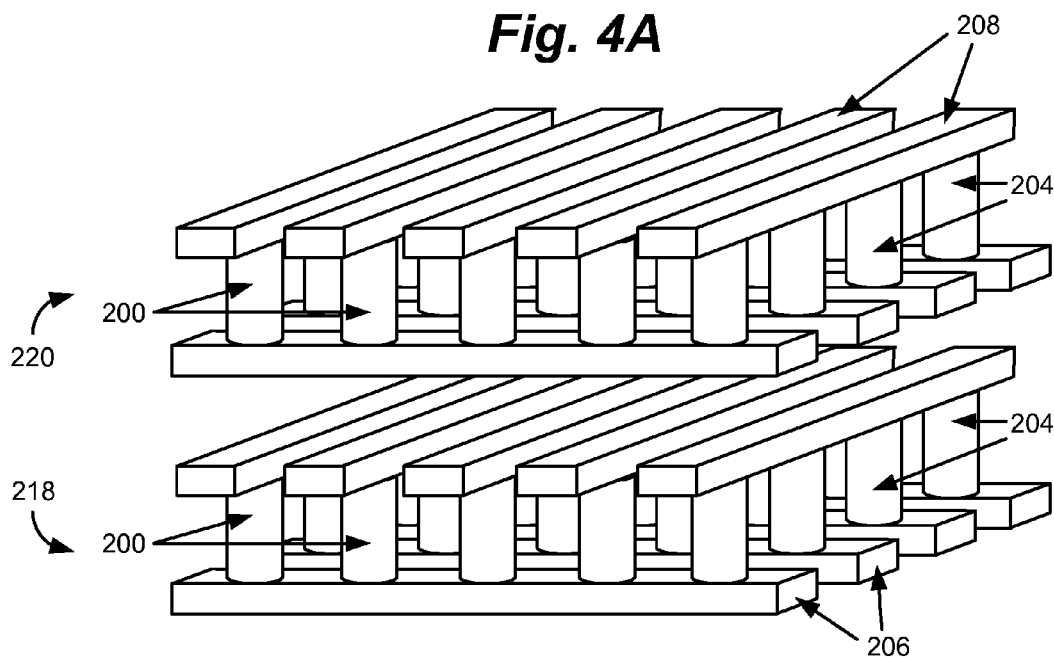
FIG. 4A is a simplified perspective view of a portion of one embodiment of a three-dimensional memory array.

Memory array 102 will comprise many memory cells. FIG. 4A is a simplified perspective view of a portion of a monolithic three dimensional array 102 that includes a first memory level 218 positioned below a second memory level 220. In the embodiment of FIG. 4A, each memory level 218 and 220 includes a plurality of memory cells 200 in a cross-point array. It will be understood that additional layers (e.g., an inter-level dielectric) may be present between the first and second memory levels 218 and 220, but are not shown in FIG. 4A for simplicity. Other memory array configurations may be used, as may additional levels of memory. In the embodiment of FIG. 4A, all diodes may "point" in the same direction, such as upward or downward depending on whether p-i-n diodes having a p-doped region on the bottom or top of the diode are employed, simplifying diode fabrication. Memory cells 200 can be the same as or different than memory cell 150.

Figure 4B:
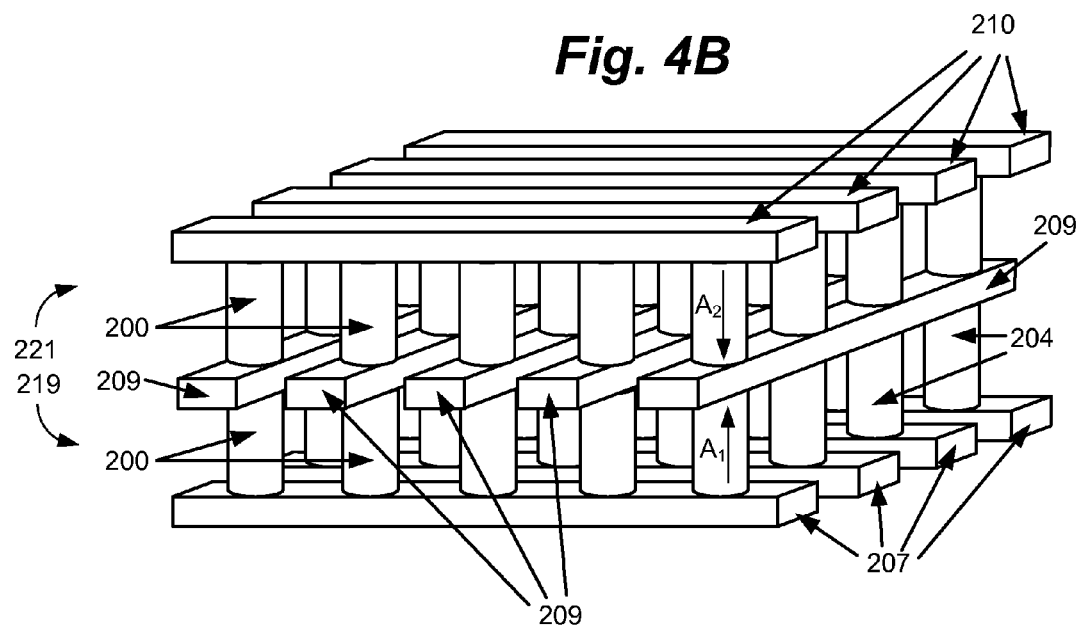
FIG. 4B is a simplified perspective view of a portion of one embodiment of a three-dimensional memory array.

FIG. 4B is a simplified perspective view of a portion of a second embodiment of a monolithic three-dimensional array 102 that includes a first memory level 219 positioned below a second memory level 221. The memory array of FIG. 4B includes a plurality of memory cells 200. With respect to first memory level 219, memory cells 200 are between and connect to a set of bit lines 207 and a set of word lines 209. With respect to second memory level 221, memory cells 200 are between and connect to a set of bit lines 210 and word lines 209. The upper conductors of a first memory level may be used as the lower conductors of a second memory level that is positioned above the first memory level, as shown in FIG. 4B. Additional information is described in U.S. Pat. No. 6,952,030, "High-Density Three-Dimensional Memory Cell," which is hereby incorporated by reference herein in its entirety.

In the embodiment of FIG. 4B, the diodes (or other steering devices) on adjacent memory levels preferably point in opposite directions, as described in U.S. Patent Application Publication No. 20070190722, filed Mar. 27, 2007 and titled "Method to Form Upward Pointing P-I-N Diodes Having Large And Uniform Current," which is hereby incorporated by reference herein in its entirety. For example, the diodes of the first memory level 219 may be upward pointing diodes as indicated by arrow $A_1$ (e.g., with p regions at the bottom of the diodes), while the diodes of the second memory level 221 may be downward pointing diodes as indicated by arrow $A_2$ (e.g., with n regions at the bottom of the diodes), or vice versa.

Figure 5A:
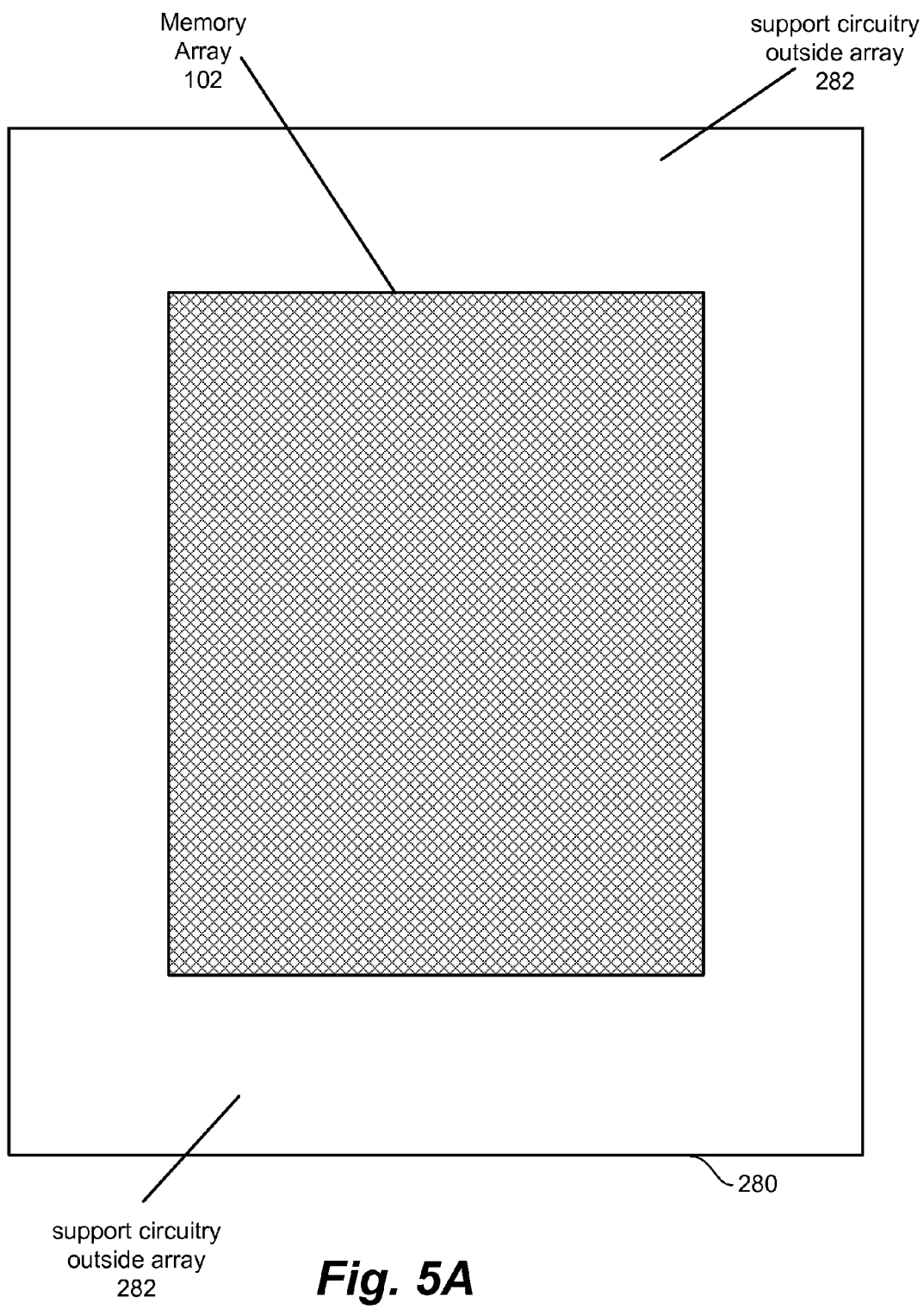
FIG. 5A depicts a top view of a memory system.

In one embodiment of a monolithic three-dimensional memory array, the bit lines are arranged in a first direction and the word lines are arranged in a second direction perpendicular to the bit lines. In a monolithic three-dimensional memory array with additional layers of memory cells, there would be additional layers of bit lines and word lines. The supporting circuitry (e.g., column control circuitry 110, row control circuitry 120, and system control logic 130) are arranged on the surface of the substrate with the memory array fabricated above all or a portion of the supporting circuitry. For Example, FIG. 5A shows a top view of memory array 102 positioned over substrate 280. Support circuitry 282 is positioned on the surface of substrate 280. Memory array 102 is positioned above support circuitry 282. Some of the support circuitry 282 is below memory array 102. Some of the support circuitry 282 is outside of memory array 102. By "outside of the memory array" it is meant that the memory array is not positioned over the circuitry that is outside of the memory array.

Figure 5B:
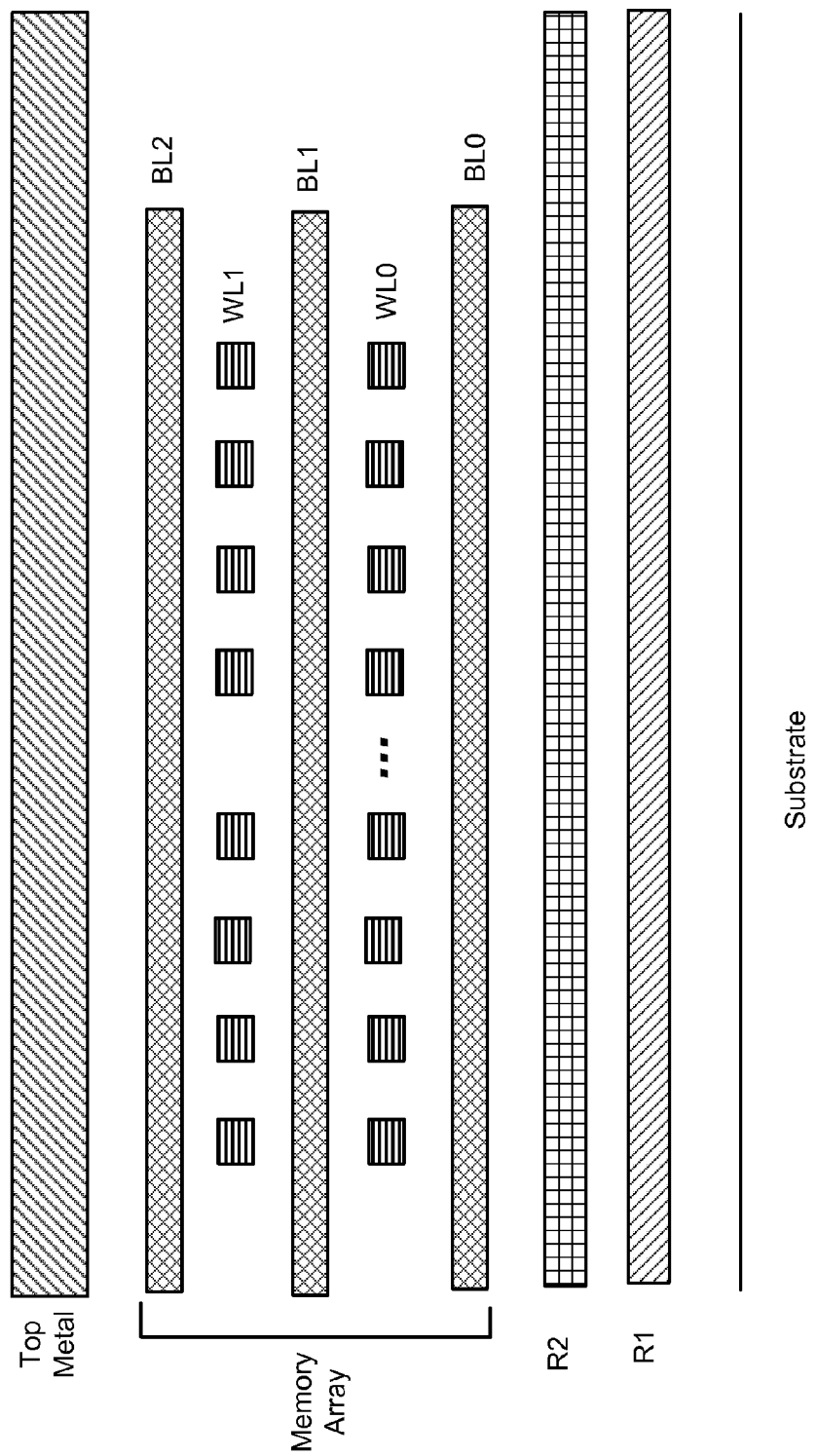
FIG. 5B depicts a subset of the layers of one embodiment of a three-dimensional memory.

FIG. 5B, which depicts various layers of an integrated circuit, shows the Memory Array positioned above the Substrate. The Memory Array includes bit line layers BL0, BL1 and BL2, and word line layers WL0 and WL1. In other embodiments, additional bit line and word line layers can also be implemented. An integrated circuit implementing a semiconductor memory system also includes multiple metal layers used for routing signals between different components of the support circuitry, and between the supporting circuitry and the bit lines and word lines. These metal layers are arranged above the support circuitry that is implemented on the surface of the Substrate and below the Memory Array. FIG. 5B shows two metal layers R1 and R2 used for routing; however, other embodiments can include more or less than two metal layers. In one example, these metal layers R1 and R2 are formed of Tungsten (about 1.5 ohm/squre), which has both a relatively high resistance and high capacitance.

Positioned above the memory array can be one or more metal layers used for routing signals between different components of the memory system. FIG. 5B shows one such metal layer above the memory array, labeled as the Top Metal layer. In one example, the top metal layer is formed of aluminum or copper (about 0.05 ohm/squre), which has a smaller resistance and capacitance than layers R1 and R2. Metals layers R1 and R2 are not implemented using the same materials as used for the Top Metal because the metal used for R1 and R2 needs to withstand the processing steps for fabricating the memory array on top of R1 and R2.

Vias can be added to make connections between adjacent metal layers. Zias can be added to make connections between layers that are not adjacent. A zia is a multi-layer via and can connect more than 2 layers (in which case the zia looks like a staircase).

Figure 6:
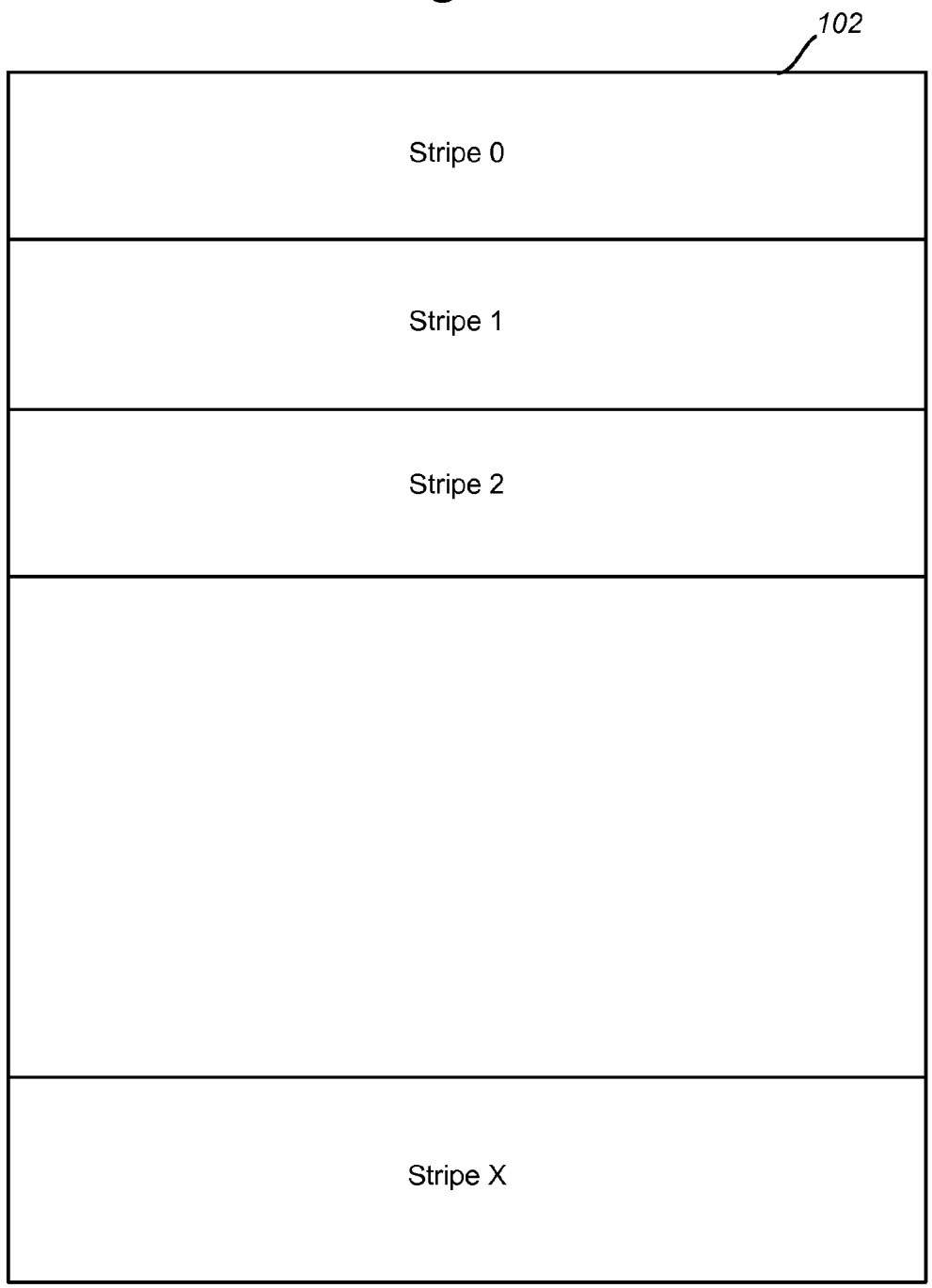
FIG. 6 depicts one example organization of a memory array.

Memory array 102 is subdivided into stripes, as depicted in FIG. 6. Each stripe is divided into blocks and blocks are grouped into bays. In one embodiment, each block includes two stripes. In other embodiments, one bay can be implemented in one strip or a portion of one stripe. In some implementations, a bay can be implemented across all or portions of two or more stripes. Each bay includes multiple blocks. The number of blocks in a bay can vary.

Figure 7:
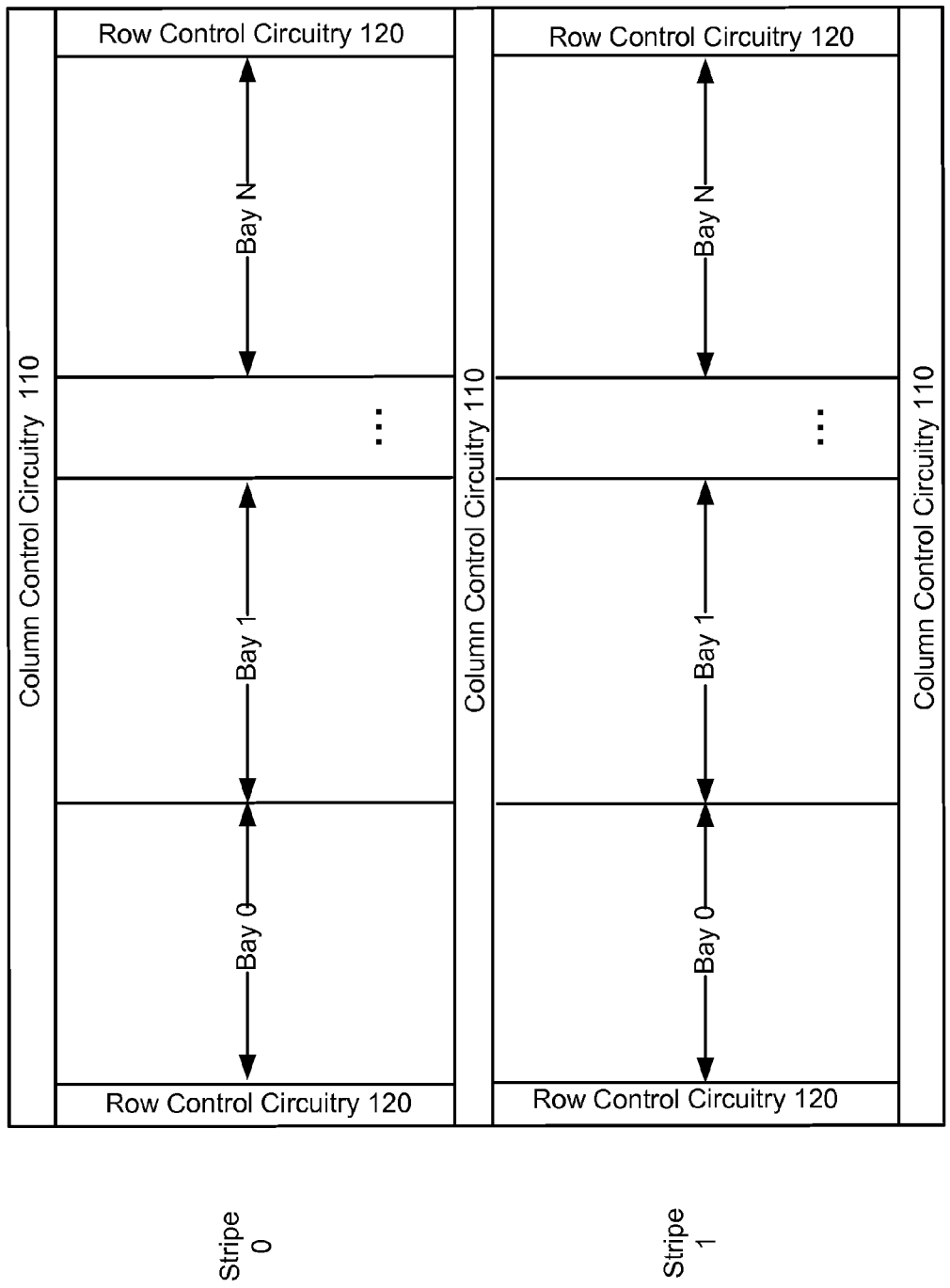
FIG. 7 depicts one embodiment of the structure of two stripes of a memory array.

FIG. 7 shows one example implementation of two stripes (Stripe 0 and Stripe 1), where each bay (Bay 0, Bay 1, . . . , Bay N) implemented across a portion of two neighboring stripes. For example, Bay 0 is partially in Stripe 0 and partially in Stripe 1. Therefore, in the example of FIG. 7, a bay includes memory cells in two stripes. The number of bay in a stripe can vary. FIG. 7 shows Column Control Circuitry 110 on opposite sides of a stripe (e.g., top and bottom) and Row Control Circuitry on different opposite sides of a stripe (e.g., left and right).

Figure 8:
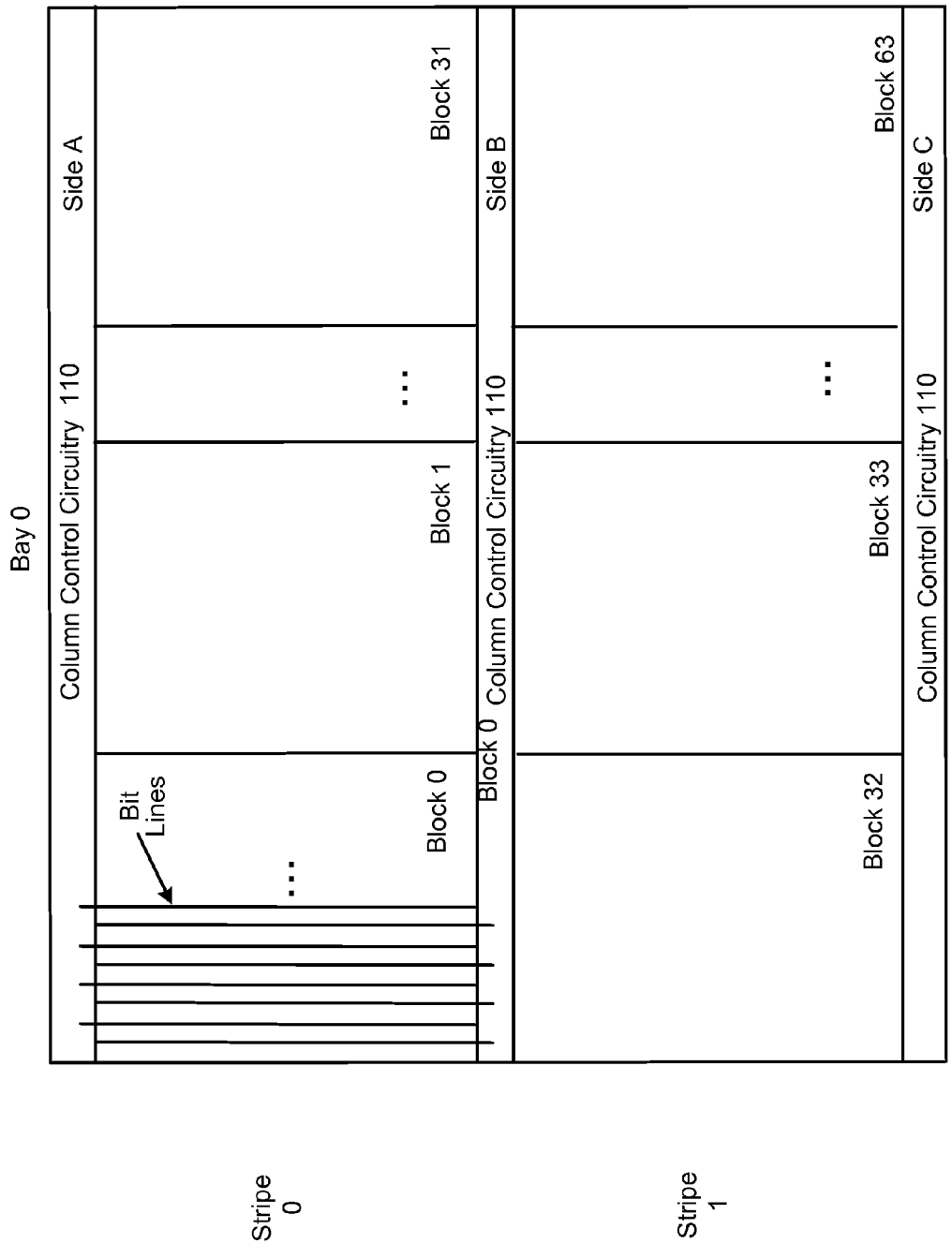
FIG. 8 depicts one embodiment of a bay.

FIG. 8 provides more details of one example bay (e.g., Bay 0), that is implemented across two stripes (e.g., strip 0 and stripe 1). In one embodiment, a bay has sixty four blocks with Block 0, Block 1, . . . , Block 31 in Stripe 0 and Block 32, Block 33, . . . , Block 63 in Stripe 1. However, other embodiments can implement a different number of blocks.

A block is a contiguous group of memory cells having contiguous word lines and bit lines generally unbroken by decoders, drivers, sense amplifiers, and input/output circuits. This is done for any of a variety of reasons. For example, the signal delays traversing down word lines and bit lines which arise from the resistance and the capacitance of such lines (i.e., the RC delays) may be very significant in a large array. These RC delays may be reduced by subdividing a larger array into a group of smaller sub-arrays so that the length of each word line and/or each bit line is reduced. As another example, the power associated with accessing a group of memory cells may dictate an upper limit to the number of memory cells which may be accessed simultaneously during a given memory cycle. Consequently, a large memory array is frequently subdivided into smaller sub-arrays to decrease the number of memory cells which are simultaneously accessed. An integrated circuit may include one or more than one memory array.

FIG. 8 shows a subset of the Bit Lines for Block 0. The substrate is wider than the memory array; therefore, portions of the Column Control Circuitry 110 can protrude out from under the memory array to facilitate connections using zias and vias to R1, R2, Top Metal, and the bit lines, while other portions of Column Control Circuitry 110 can be positioned under the memory array. Column Control Circuitry 110 (including decoders and sense amplifiers) is divided into two sets of circuits, with each set of circuits being located on opposite sides (e.g. Side A and Side B) of the integrated circuit so that one set of circuits of Column Control Circuitry 110 protrudes out from a first side (Side A) of the memory array and the second set of circuits of Column Control Circuitry 110 protrudes out from the opposite side (Side B) of the memory array. Half of the bit lines for a block are connected to one set of circuits of Column Control Circuitry 110 on side A and the other half of the bit lines for a block are connected to the second set of circuits of Column Control Circuitry 110 on side B. In one embodiment, these two sets of bit lines are interleaved so that every other bit line connects to Column Control Circuitry 110 on side A and the intervening bit lines connect to Column Control Circuitry 110 on side B. There could be cases in which two neighboring bit lines are picked from side A and the next 2 from side B. This depends on process. Other blocks in the bay are similarly arranged (e.g., sides B and C, etc.). In one embodiment, the bit lines are shared between upper and lower blocks. For example, even bit lines in Block 32 of Stripe 1 are shared with even bit lines in Block 0 of Stripe 0. Similarly, odd bit lines in Block 32 of Stripe 1 are shared with odd bit lines in Block 0 of Stripe 0. In this manner, column control circuitry 110 can decode and driver bit lines for its upper or bottom blocks.

In one embodiment, there are two sense amplifiers located below each block, for example, on the surface of the substrate. One of the two sense amplifiers are for bit lines that connect to Column Control Circuitry 110 on side A and the other sense amplifier is for bit lines that connect to Column Control Circuitry 110 on side B. In the embodiment that includes 64 blocks in a bay, there are 64 sense amplifiers for a bay with 32 for side A and 32 for side B. In one embodiment, one property of a bay is that all of the blocks in the bay share the same 64 sense amplifiers. That means that 64 memory cells in a bay can be simultaneously selected for programming or reading. Thus, the memory system includes circuits for selecting the 64 memory cells and lines for routing signals between the 64 selected memory cells and the sense amplifiers. In some embodiments, less than 64 memory cells are selected for simultaneous programming in order to limit the power used at any given time.

In previous systems, global routing lines for routing signals between the 64 (or less) selected memory cells and the sense amplifiers were implemented in metals layers R1 or R2, which have a relatively large resistance and capacitance. To reduce overall resistance and capacitance, some previous designs have implemented half of the global routing lines for routing signals between the selected memory cells and the sense amplifiers in R1 (or R2) and the other half of the global routing lines for routing signals between the selected memory cells and the sense amplifiers implemented in Top Metal. While this scheme does reduce resistance and capacitance, the reduction is not enough to allow for high speed operation. In previous implementations, each one of the global routing lines were touching all decoding transistor drains, which increase the total capacitance associated to the line.

To further reduce resistance and capacitance in data lines between selected memory cells and the sense amplifiers, a sectional data line scheme can be used. Local data lines are provided for each section, where a section can include one, two, four, or another number of blocks. Selection circuits are used to connect the local data lines to the appropriate bit lines. Sense amplifier outputs are provided to global data lines across all bays. Selection circuits are used to connect the global data lines to the appropriate local data lines.

Figure 9:
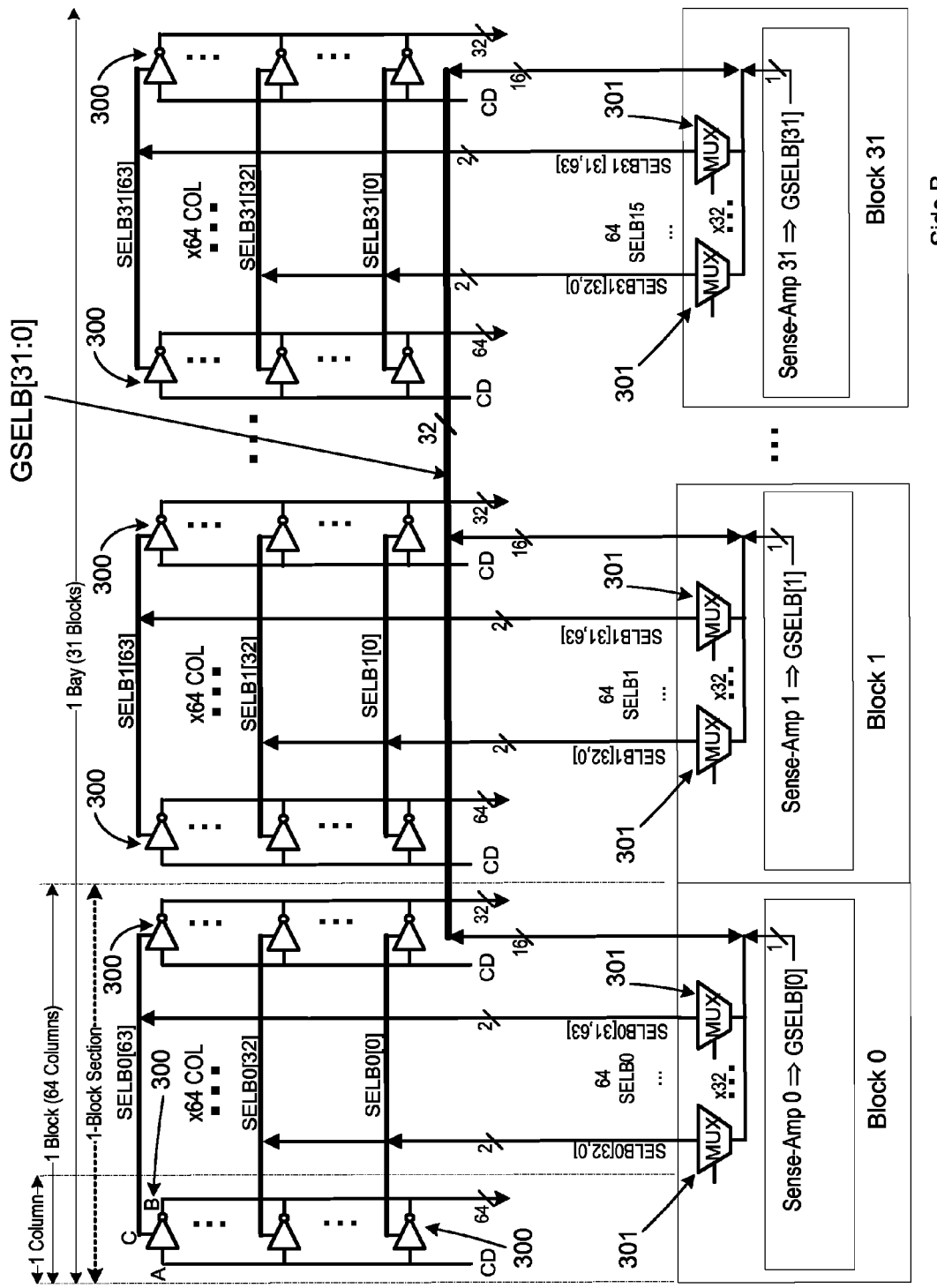
FIG. 9 is a schematic diagram of one embodiment of the data lines and selection circuits for connecting bit lines to the column control circuitry via the data lines.

FIG. 9 is a schematic diagram that depicts a portion of the routing signals and selection circuits for one embodiment of Column Control Circuitry 110. Depicted are portions of three blocks: Block 0, Block 1 and block 31. For each block, the bit lines are grouped into columns. Each block has 64 columns of selection circuits 300 for electrically connecting bit lines of the column to sense amplifiers on one side of the array (e.g. side A FIG. 8) and 64 columns of selection circuits for connecting to bit lines to sense amplifiers on the other side of the array (e.g. side B of FIG. 8). FIG. 9 only shows the 64 columns of selection circuits 300 for connecting to side B. Each block, therefore, has 64 columns×64 bit lines per column×2 (top and bottom)=8192 bit lines for every block. In one embodiment, the three dimensional memory array includes four layers, with 2048 bit lines per layer. Other arrangements of the decoding circuits, bit lines and layers can also be used.

In the embodiment of FIG. 9, each block has its own set of local data lines. For example, block 0 includes SELB0[63:0], block 1 includes SELB1[62:0], ... block 31 includes SELB31[63:0]. In one embodiment, the local data lines SELB0[63:0], SELB1[63:0], ... SELB31[63:0] are implemented in metal layer R1 under their respective block, and only run the width of the respective block. Selection circuits 300 for a particular column are used to selectively connect the 64 bit lines for that same column to 64 respective local data lines (SELB0[63:0], SELB1[63:0], ... or SELB31[63:0]). As can be seen from FIG. 9, each of the selection circuits 300 receives a selection signal CD from column decoders 112 and a bit line connection from one of the 64 bit lines associated with the column. Based on the selection input from column decoder 112, the selection circuit 300 will connect or disconnect the bit line to a respective one of the local data lines (e.g., SELB0[63:0], SELB1[63:0], ... SELB15[63:0]).

Looking back at FIG. 8, column decoders 112 choose one column and send to that chosen column a selection indication on the appropriate selection signal line CD so that the chosen column connects the respective 64 bit lines to the local data lines (SELB0[63:0], SELB1[63:0], ... or SELB15[63:0]). Each block has its own set of thirty two 2:1 multiplexers (e.g., MUX 301) that are associated with the block and located on the substrate below the block. Each set of sixty four local data lines (SELB0[63:0], SELB1[63:0], ... or SELB15[63:0]) are connected to a respective set of thirty two 2:1 multiplexers (MUX) for that respective block. For example, in block 0 the first multiplexer receives SELB0[0] and SELB0[32], the second multiplexer receives SELB0[1] and SELB0[63], ... the thirty second multiplexer receives SELB0[31] and SELB0[63]. Each of the multiplexers in a block receives a common selection signal and an enable signal from column decoders 112 so that thirty two of the sixty four local data lines are selected. In one embodiment, the multiplexers include the ability to bias the unselected SELB.

The thirty two selected local data lines are connected to global data lines GSELB[31:0] so that a memory operation (e.g. Read, SET, RESET) is performed on the selected memory cells. For example, SELB0[0] is selectively connected to GSELB[0], SELB0[1] is selectively connected to GSELB[1], etc. or SELB0[32] is selectively connected to GSELB[0], SELB0[33] is selectively connected to GSELB[1], etc. The global data lines GSELB[32:0] are implemented in Top Metal and connections between global data lines GSELB[15:0] and multiplexers (MUX) are made using zias (or vias). The global data lines GSELB[31:0] run across the entire Bay, with each Bay having its own set of global data lines. To reduce coupling between global data lines, various forms of Top Metal isolation can be used.

Each of the global data lines GSELB[32:0] are connected to one of the sense amplifiers. For example, the output Sense-Amp0 of the sense amplifier located underneath block 0 is connected to GSELB[0], the output Sense-Amp1 of the sense amplifier located underneath block 1 is connected to GSELB[1], ... and the output Sense-Amp31 of the sense amplifier located underneath block 31 is connected to GSELB[31]. Thus, the output of a particular sense amplifier is connected to a global data line, then to a local data line by way of a multiplexer, and then to a bit line by way of a selection circuit 300. Because the global data lines are implemented in Top Metal, and Top Metal has significantly less resistance than metal layers R1 and R2, the signal path from the sense amplifiers to the memory cells has a lower resistance. Capacitance is also reduced because the number of transistors that are "off" and are touched by the decoding line is reduced. The total parasitic capacitance of the bit line drivers (source-to-well parasitic cap) is reduced by having a sectional data-line, by reducing number of bit line drives for each data-line (SELB).

As mentioned above, FIG. 9 only shows the connection paths to sense amplifiers on one side (e.g., side B) of the blocks. Thus, there is another set of local data lines for each block, another set of global data lines for each bay and another set of sense amplifiers for each bay in addition to that which is depicted for FIG. 9. Therefore, a selected block is associated with 128 selected bit lines that are connected to 128 local data lines, for which 64 multiplexers choose 64 local data lines to connect to 64 global data lines. The 64 global data lines are connected to 64 sense amplifiers associated with that particular bay. Therefore, at any given time 64 memory cells in a block can be simultaneously programmed. In some embodiments, less than 64 memory cells in a block will be simultaneously programmed to reduce power. The choice of 64 blocks in a bay, 128 bit lines in a column, using 128 local data lines, and 64 global data lines is for one set of embodiments. In other embodiments, different numbers of each item can be used.

Figure 10:
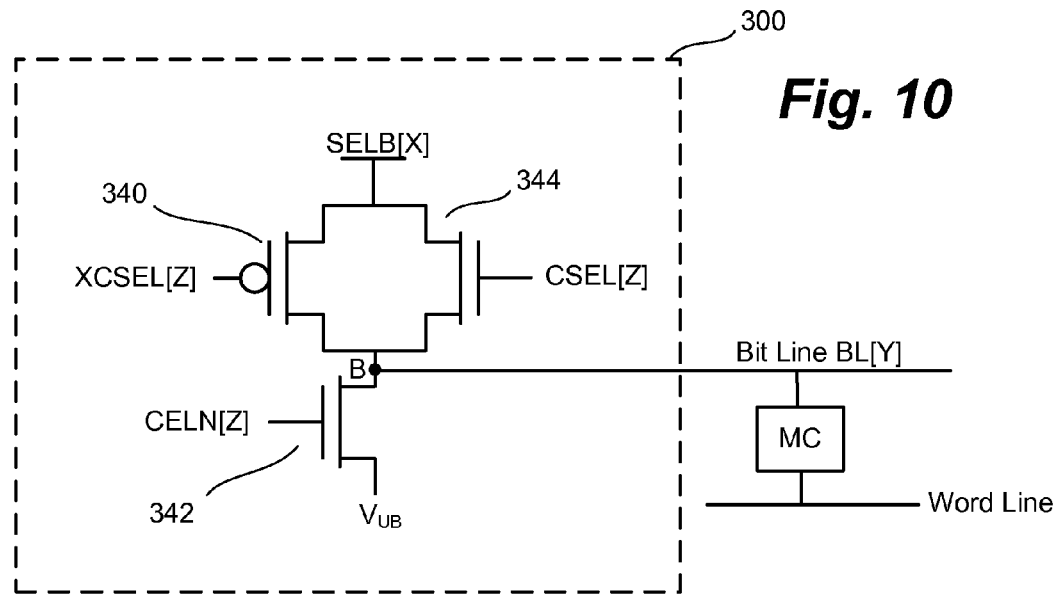
FIG. 10 is a schematic diagram of one embodiment of a selection circuit.

FIG. 10 is a schematic diagram showing the details of one embodiment of selection circuits 300. The selection circuit 300 is connected to one of the local data lines (labeled in FIG. 9 as SELB_[X]) and one of the bit lines. The bit line is connected to one terminal of the memory cell MC. A word line is connected to the other terminal of the memory cell MC. Selection circuit 300 includes transistor 340 and transistor 344 both connected to SELB_[X]. Transistor 340 and transistor 344 are also both connected to transistor 342 at node B. The respective bit line BL[Y] is also connected to node B. Transistor 342 is also connected to VUB (e.g. 0.5 v), the unselected bit line voltage. The gate of transistor 340 is connected to selection signal XCSEL[Z]. The base of transistor 344 is connected to selection signal CSEL[Z]. Note that XCSEL[Z] is an inverted version of CSEL[Z]. The base of transistor 342 is connected to CELN[Z]. The signals CSEL [Z], XCSEL[Z], and CELN[Z] are provided by column decoder 112. In other embodiments, those signals can be provided by other circuits, such as system control logic 130, driver circuitry 114, sense amps 118 or other portions of column control circuits. The signal CELN[Z] is independently controlled so that transistor 342 can be independently controlled from transistors 340 and 342. Each column will have its own independent CELN[Z] so that all bit lines in that column have the same CELN[Z].

When the respective column is selected, XCSEL[Z] is 0 and CSEL[Z] is 1; therefore, transistors 340 and 344 are on. This condition connects the bit line BL[Y] with the local data line SELB[X].

When the respective column is not selected, then XCSEL [Z] is 0 and CSEL[Z] is 1; therefore, transistors 340 and 344 are off. This condition disconnects the bit line BL[Y] from the local data line SELB[X]. When transistors 340 and 344 are off and CELN[Z] is 1, then transistor 342 is on and the bit line BL[Y] is receiving the unselected bit line voltage VUB. When transistors 340 and 344 are off and CELN[Z] is 0, then transistor 342 is off and the bit line BL[Y] is floating. This condition is useful for the some embodiments of the capacitance discharge method of programming described herein.

Figure 11:
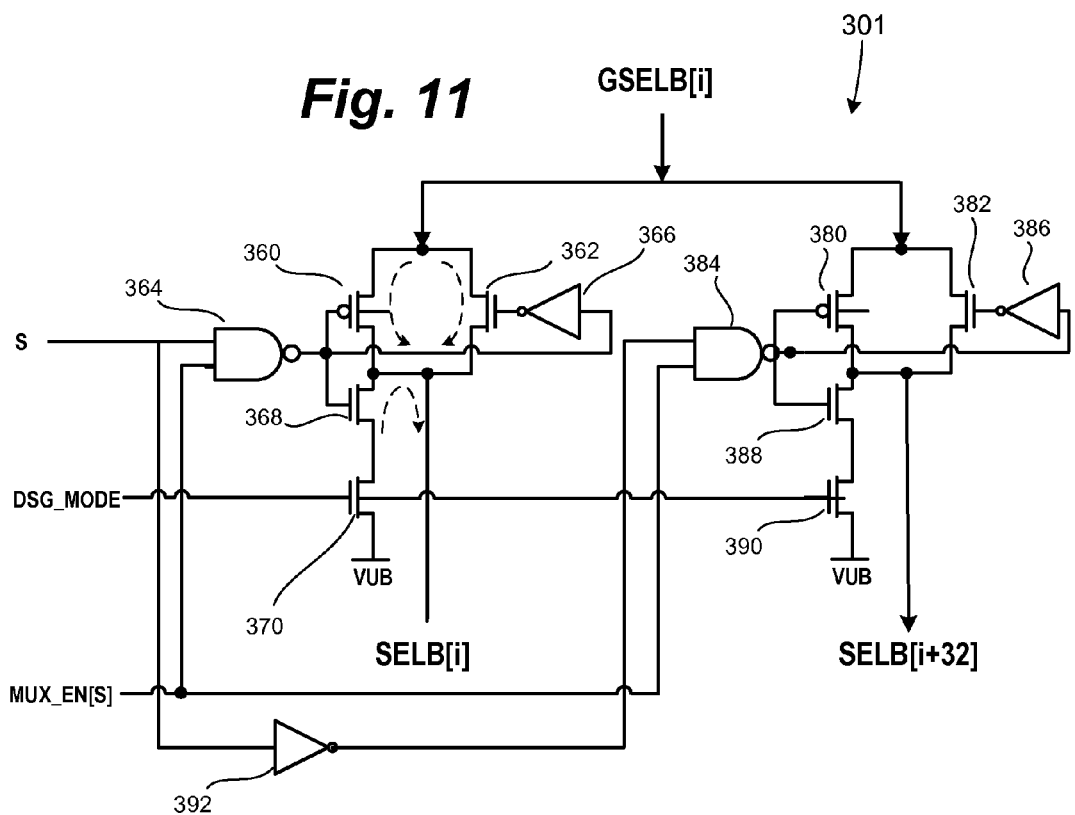
FIG. 11 is a schematic diagram of one embodiment of a multiplexer circuit.

FIG. 11 is a schematic of a circuit for the 2:1 multiplexer (MUX 301) depicted in FIG. 9. The respective global data line GSELB[i] is connected to transistors 360, 362, 380 and 382. Transistors 360 and 362 are also connected to the first of the two local data lines SELB[i]. Thus, transistors 360 and 362 provide a path between the global data line GSELB[i] and the local data line SELB[i] when the transistors are on. In addition to being connected to GSELB[i], transistors 380 and 382 are also connected to the second local data line SELB[i+32]. Thus, transistors 380 and 382 provide a path between global data line GSELB[i] and the second local data line SELB[i+32] when the transistors are on.

The inverted gate of transistor 360 is connected to the output of NAND gate 364. The gate of transistor 362 is connected to the output of inverter 366. The input of inverter 366 is connected to the output of NAND gate 364. The output of NAND gate 364 is also connected to the gate of transistor 368. Transistor 368 is connected between SELB[i] and transistor 370. Transistor 370 is connected between transistor 368 and the voltage VUB. The gate of transistor 370 receives the signal DSG_MODE from system control logic 130. The signal DSG_MODE is set to 0 when performing one of the possible embodiments of the programming operation using the capacitance discharge mode of programming described herein. By setting signal DSG_MODE to 0, transistor 370 will prevent an unselected local data line from being connected to VUB and, instead, cause the unselected local data line to float.

The output of NAND gate 384 is connected to the gate of transistor 380, the input of inverter 386 and the gate of transistor 388. The output of inverter 386 is connected to the gate of transistor 382. Transistor 388 is connected between local data line SELB[i+32] and transistor 390. Transistor 390 is connected between transistor 388 and the voltage VUB. The gate of transistor 370 receives the signal DSG_MODE from system control logic 130.

NAND gate 364 receives two inputs from system control logic 130: multiplexer select S and MUX_EN[S]. NAND gate 384 receives two inputs from system control logic 130: an inverted version of multiplexer selection signal S (via inverter 392) and MUX_EN[S]. The signal MUX_EN[S] is normally set to 1 during a memory operation, but can be set to 0 to disable the multiplexer. MUX_EN[S] may be used to disable the multiplexer when less than all 32 global data lines will be used for simultaneous programming.

The circuits of FIGS. 8-11 can be used to implement the capacitive discharge method of programming discussed above. The circuit of FIG. 10 will be used to connect a column of bit lines to the local data lines SELB[63:0] and the circuit of FIG. 11 is used to connect half of the local data lines SELB[63:0] to the global data lines GSELB[32:0]. Once both connections are made, the thirty two sense amplifiers are in communication with thirty memory cells via the global data lines, the local data line and the bit lines for each side. During a SET operation, the sense amplifiers will apply a voltage to the global data lines to charge up the global data lines due to the parasitic capacitance of the global data lines. When the multiplexers of FIG. 11 (which are one embodiment of a selection circuit) connect the local data lines to the global data lines, then the local data lines will also be charged up. When the selection circuits of FIG. 10 (which are one embodiment of a selection circuit) connect the local data lines to a set of bit lines, sixteen of the bit lines will also be charged. Once the bit line is charged, the signals XCSEL[Z] and CSEL [Z] are toggled, which cuts off the bit line and leaves the bit line floating so that over time the bit line will discharge through the memory cell causing the memory cell to SET, as described above. Once the signals XCSEL[Z] and CSEL [Z] are toggled, the word line selection (discussed below) can change so that programming for the next word line will commence.

Figure 12:
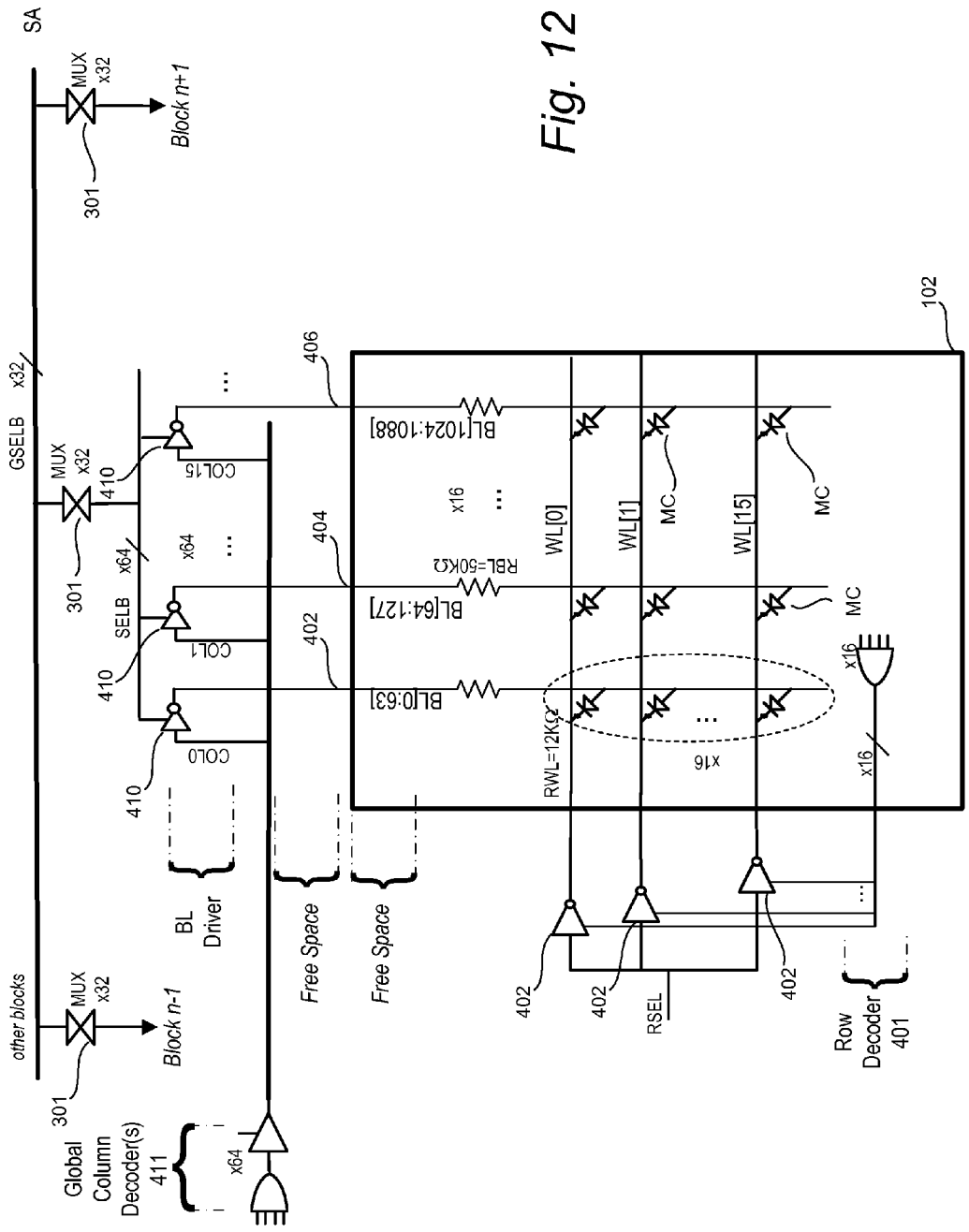
FIG. 12 depicts a portion of a memory array and support circuits.

FIG. 12 depicts a portion of one block of memory array 102 and various supporting circuitry. The block depicted in FIG. 12 includes a set of word lines WL[0], WL[1] ... WL[15]. The word lines are connected to word line drivers 402 (same structure as bit line drivers 300), which are controlled by one or more row decoders 401. In one embodiment, row decoders 401 are positioned on the substrate surface and underneath memory array 102. As discussed above, the bit lines are grouped into columns of bit lines. In one example, one block will include sixty four columns of bit lines. FIG. 12 only shows sixteen of the sixty four columns of bit lines (col 0, col 1, ... col 15). Column 0 includes bit lines BL[0:63], column 1 includes bit lines BL[64:127], ... column 15 includes bit lines BL[1024:1088].

Sets of bit line drivers 410 are used to selectively connect bit lines to the local data lines (SELB). In one embodiment, each of the sets of bit line drivers 410 include sixty four selection circuits 300 (see FIGS. 9 and 10). Those bit lines locally connected to the appropriate local data lines (SELB) will be in communication with multiplexor 301, as described above. For one side (A side or B side), thirty two of the sixty four bit lines connected to multiplexor 301 will be in communication with the global data lines GSELB. As discussed above, the global data lines GSELB are in communication with sense amplifiers, which are one example of an appropriate signal source for driving the programming of the memory cells MC connected to corresponding bit lines and word lines. One example implementation uses thirty two multiplexer circuits 301 for each block.

Each of the selection circuits 300 included in sets of bit line drivers 410 are controlled by a set of one or more global column decoders 411. In one embodiment, there are sixty four sets of global column decoders 411 for each strip and the global column decoders 411 are positioned on the substrate surface outside of memory array 102 (e.g., not beneath memory array 102). One global column decoder 411 is shared by all blocks of a particular stripe. Therefore, when the global column decoder 411 chooses column 0 of a particular block, column 0 is chosen for every block in the stripe.

Multiplexer circuits 301 are used to selectively connect the respective local data lines SELB to the global data lines GSELB so that only local data lines for one block are connected to the global data lines GSELB. Because all of the blocks in the stripe share the same column decoder, space is freed up on the substrate surface, as compared to prior designs (see "Free Space"). One reason that the column decoders can be global for the entire stripe is that it is not necessary to have a decoder local to each block. Prior designs would have a decoder for each block local to each block to increase the speed for switching columns. However, the present technology does not switch columns during a programming process; therefore, there is not a need for fast column switching. In one embodiment, there is a global column decoder circuit 411 for each of the sixty four columns of a block. The global column decoders 411 and row decoders 401 are in communication with system control logic 130 (see FIG. 1).

In one embodiment, the system programs one page of data across multiple word lines and within one column bit lines for a block by selecting one column bit lines of the block using the column decoders 411 and programming the memory cells connected to the bit lines of the selected column and multiple word lines while maintaining the selection of the one column. That is, the row decoders 410 will select one column. Sixty four bits for the column (thirty two bits bit lines from the side A and thirty two bit lines from side B) will be connected to the local sensor amplifiers (via the global data lines SELB, multiplexor circuits 301, local data lines SELB and sets of bit line drivers 410). Once the column is selected, one embodiment will include multiple world line cycles for each column. Each word line cycle will include programming those memory cells connected to the selected bit lines in the column and the word line selected for the word line cycle. In embodiments that have sixteen word lines, there will be sixteen word line cycles with one word line cycle for each word line. For example, during the first word line cycle word line WL[0] will be selected. The sixty four bits line selected for programming are connected to memory cells that are also connected to word line WL[0]. Those memory cells will be programmed during that word line cycle. In the next word line cycle, the same sixty four bit lines will be connected to sixty four memory cells also connected to word line WL[1].

In some embodiments, the system has enough power to concurrently (e.g., overlapping in time even if they do not start or stop at the exact same time) program all sixty four memory cells connected to the same word line and the sixty four selected bit lines. In other embodiments, the system will only be able to concurrently program a subset of the sixty four memory cells due to power requirements. Therefore, a word line cycle can have multiple sense amplifier cycles. During a sense amplifier cycle, a subset of the selected memory cells are programmed. If the system can only supply enough power to program sixteen memory cells at a given time, then a particular word line cycle will have four sense amplifier cycles with sixteen of sixty four memory cells being programmed in each memory sense amplifier cycle. In other embodiments, there can be a different number of word line cycles, a different number of sense amplifier cycles, a different number of memory cells concurrently programmed in each sense amplifier cycle, etc. During all of the word line cycles for a column and all the sense amplifier cycles for any of the word line cycles, the system will maintain the same column address.

Figure 13:
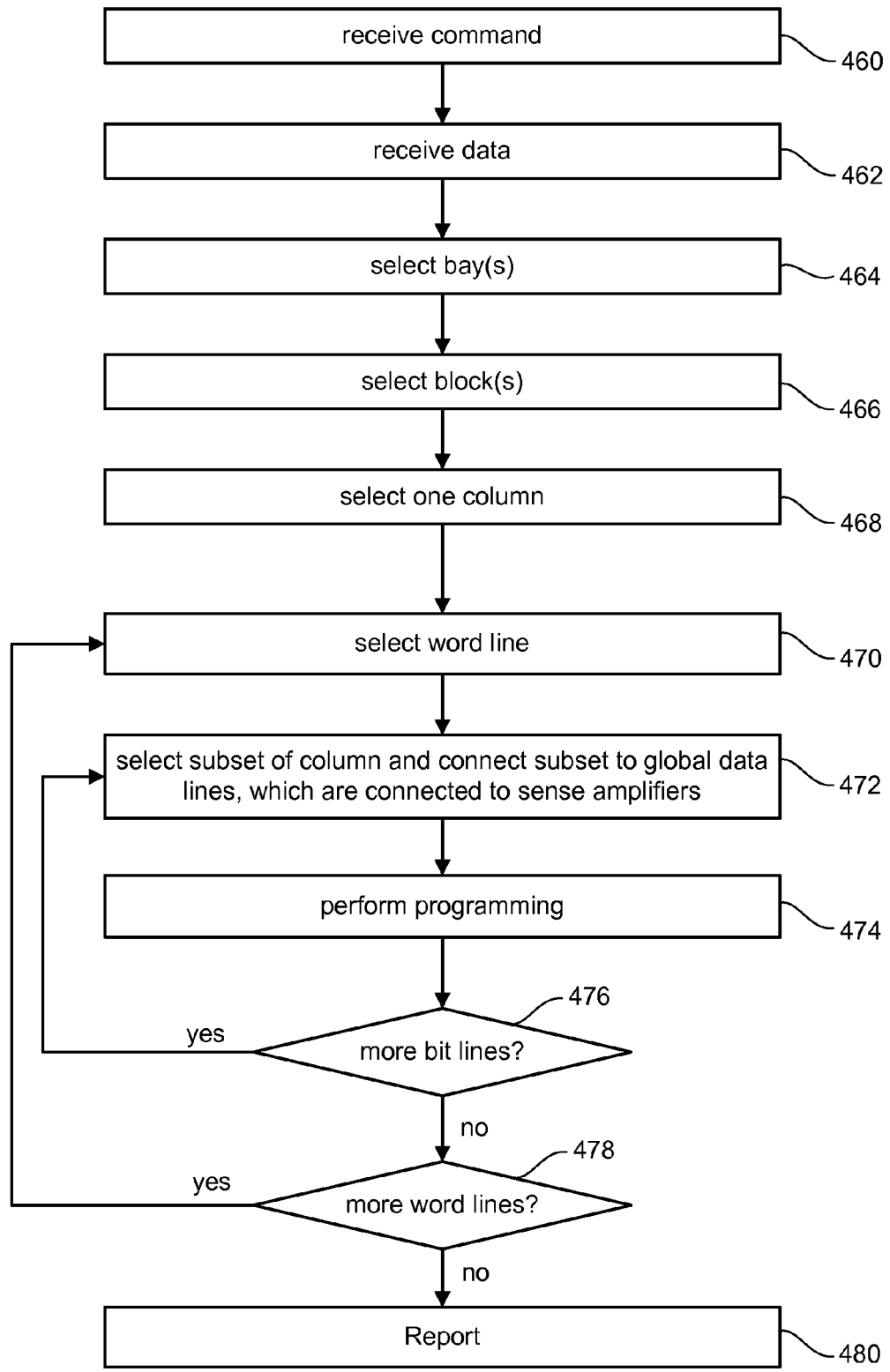
FIG. 13 is a flow chart describing one embodiment of a process for storing a page of data across multiple word lines.

FIG. 13 is a flow chart describing one embodiment for programming the system of FIG. 12. In step 460, a command is received by system logic 130 from controller 134 requesting that data be programmed. The data for the programming operation is received by system control logic 130 in step 462. In step 464, one or more bays are selected for programming. In step 466, one or more blocks within the selected bay are selected for programming. In step 468, one column in the selected block(s) is/are selected for programming. A page of data is a unit of data that is programmed at a given time. In one embodiment, one page of data is programmed into one block. In other embodiments, one page may be programmed across multiple blocks. In embodiments that program a page across multiple blocks, the multiple blocks storing the data for the common page will be in different bays and/or in different stripes. The exact size of a page, the exact size of a block, the exact size of a bay, the exact size of a stripe and the number of blocks storing data for a common page all vary based on the particular implementation. In one example, a page stores 2048 bits of data, a page of data is stored in two blocks with 1024 bits of data in each block, and the two blocks storing a page of data are in different bays and/or different stripes.

In step 470, a first word line is selected in the block. In step 472, a subset of the selected column of bit lines is chosen. In this embodiment, as discussed above, less than all sixty four selected bit lines for a block can be programmed at the same time due to power requirements. Therefore, step 472 includes selecting a subset of those sixty four selected bit lines for a sense amplifier cycle. Those selected subsets of bit lines are connected to the appropriate global data lines, which are connected to sense amplifiers (as discussed above). In step 474, programming is performed on the memory cells connected to the selected word line and the subset of bit lines selected in step 472. In step 476, it is determined whether there are more bit lines to select in the column. If so, then the process loops back to step 472 and chooses the next subset of bit lines in the column and performs programming in step 474. Thus, steps 472, 474 and 476 perform the various sense amplifier cycles for a given word line cycle. When all the bit lines have been programmed, then it is determined in step 478 whether there are any more word lines to program for the particular block. If there are more word lines to program, then the process loops back from step 478 to step 470. Therefore, steps 470 and 478 perform a word line cycle. When all word line cycles have been completed (step 478), then the programming process is complete and system control logic 130 will report a successful or unsuccessful programming in step 480.

Figure 14:
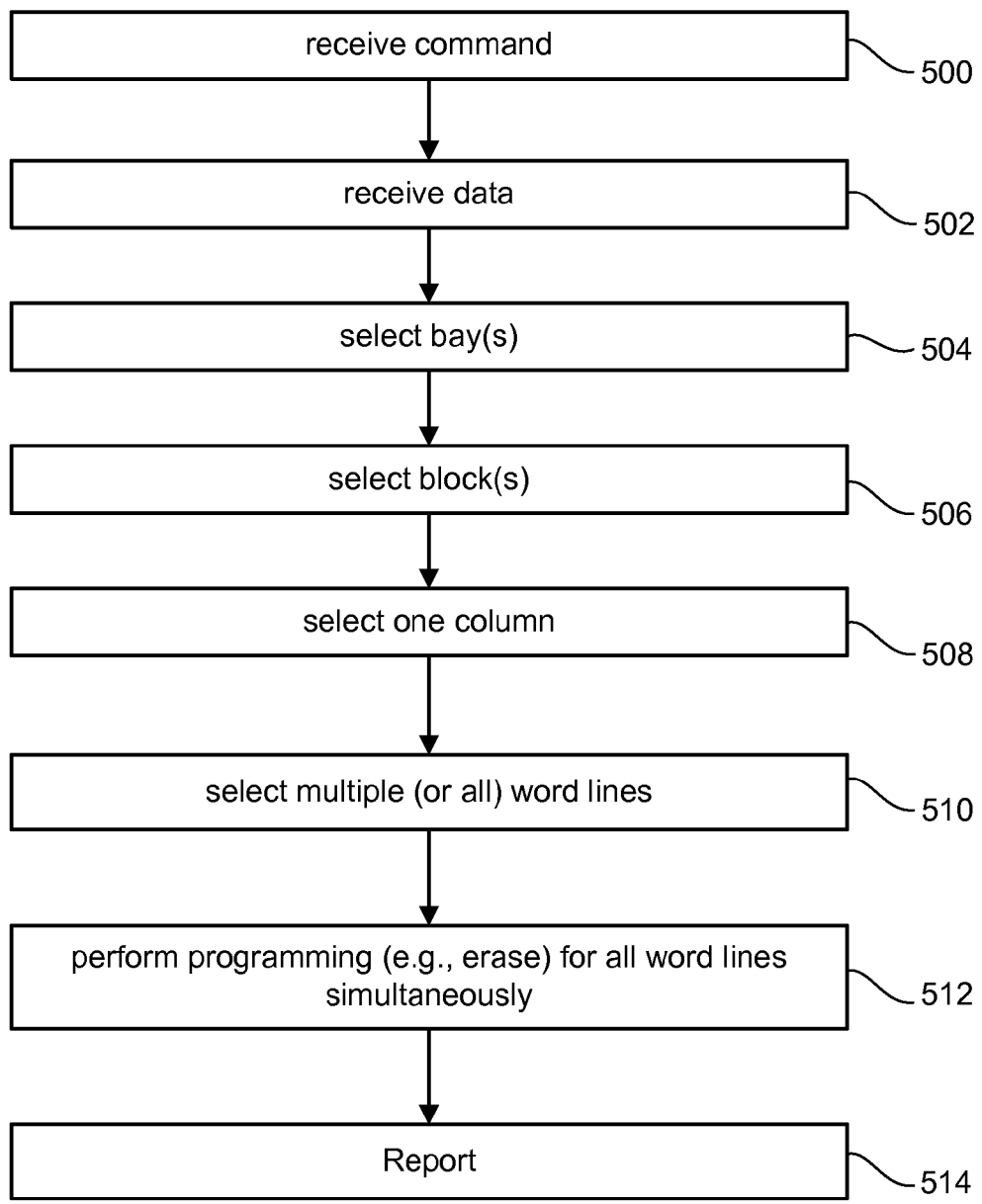
FIG. 14 is a flow chart describing one embodiment of a process for storing a page of data across multiple word lines.

FIG. 14 is a flow chart that describes a process (that can be used by the structure of FIG. 12) for concurrently programming memory cells that are in the same column and connected to different word lines. In one embodiment, this allows for an erase operation to be performed across multiple word lines. In step 500 of FIG. 14, a programming command is received by system control logic 130. In step 502, data for programming is received by system control logic 130. If the command received is a request to perform an erase operation, then there is no need to receive data in step 502. The process of FIG. 14 can be used for an erase operation or a multi-memory cell programming operation across multiple bit lines. An erase operation is not data dependent as all memory cells being erased are programmed to the same state. In step 504, one or more bays are selected for performing the programming operation. In step 506, one or more blocks are selected for performing the program operation. In step 508, one column in the selected block(s) is selected. In step 510, multiple word lines (or all word lines) are selected for performing the operation. In step 512, the programming operation (e.g. erase) is performed concurrently for all the selected word lines. For example, if all sixteen word lines depicted in FIG. 12 were selected in step 510, then 1028 bits will be programmed simultaneously because all sixty four bit lines will be connected to all sixteen word lines so that 16×64 memory cells are programmed simultaneously. In step 514, system control logic 130 will report success or failure of the operation.

Figure 15:
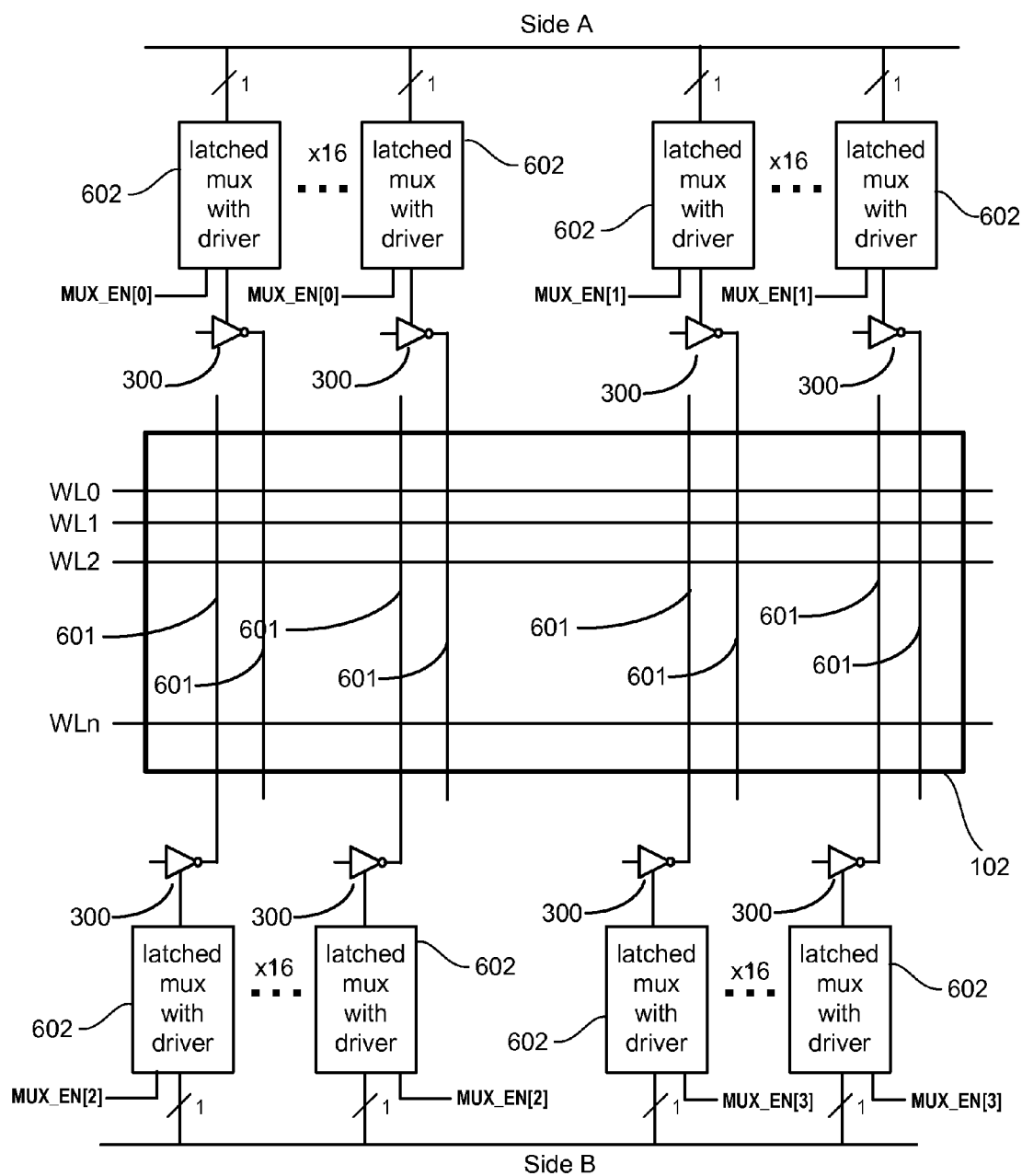
FIG. 15 depicts a portion of a memory array and support circuits.

As discussed above, in some embodiments the system does not program all sixty four memory cells connected to a column of bit lines and a single word line due to power requirements. In those cases, a word line cycle is divided into multiple sense amplifier cycles. In one embodiment, this means reloading the data on the global data lines (GSELB) for every sense amplifier cycle. FIG. 15 provides an embodiment where the data need only be loaded once for each word line cycle, and this data will then be available for all (or at least a subset of multiple) sense amplifier cycles. The structure of FIG. 15 shows a portion of one block of memory array 102. Word lines WL[0], WL[1], WL[2], . . . WL[15] form a cross point array with bit lines 601. The bit lines are depicted in columns of bit lines connected to groups of selection circuits 410.

In the embodiment of FIG. 15, multiplexor 301 is replaced by latched multiplexor with driver 602. Each bit line 601 is connected to a selection circuit 300 which provides a selective connection to the appropriate local data line (SELB), which is connected to a latched multiplexor with driver 602. FIG. 15 depicts sixty four latch multiplexors with drivers 602: 32 latched multiplexors with drivers 602 for top (side A) and 32 latched multiplexors with drivers 602 for the bottom (side B). The 64 latched multiplexors 602 are divided into four groups of sixteen latched multiplexors with drivers 602. Each group corresponds to a sense amplifier cycle. Each group of latched multiplexors with drivers 602 includes its own enable signal. For example, the first group of sixteen latched multiplexors with drivers 602 receives MUX_EN[0], the second group of latched multiplexors with drivers 602 receives MUX_EN[1], the third group of latched multiplexors with drivers 602 receives MUX_EN[2], and the fourth group of latched multiplexors with drivers 602 receives MUX_EN[3].

Figure 16:
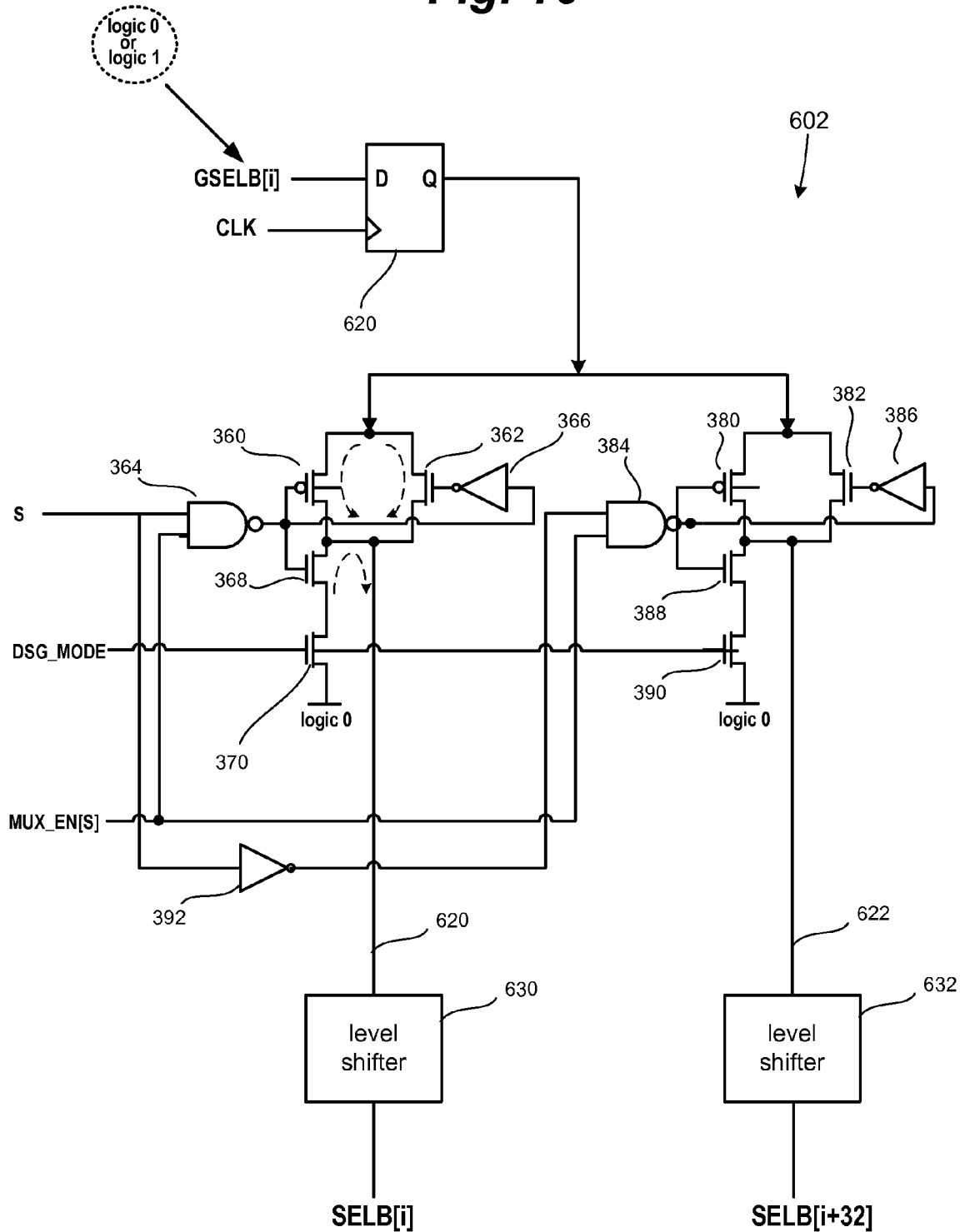
FIG. 16 is a schematic diagram of one embodiment of a multiplexer circuit.

FIG. 16 provides more details of the latched multiplexor with drivers 602, which includes a storage device, a select circuit and a level shifter/driver. In one embodiment, the storage device includes flip flop 620, which is used to store the data for the current word line cycle. The D input to flip flop 620 receives one bit of GSELB[i] each pulse received at the CLK input. In other embodiments, a latch or other storage device can be used instead of the D flip flop. In other embodiments, more than one level of flip flops or latches can be used. The output of D flip flop 620 is provided to the select circuit which includes the multiplexor circuit described above with respect to components 360-390 of FIG. 11. All the same reference numbers from FIG. 16 that correspond to FIG. 11 are used to identify the same components that perform the same function. A difference between the multiplexor of FIG. 16 and the multiplexor of FIG. 11 is that the output of the multiplexor of FIG. 11 is provided directly to the local data lines. However, the multiplexor (select circuit) of FIG. 16 provides the outputs 620 and 622 to level shifter 630 and level shifter 632, respectively. Level shifter 630 is connected to SELB[i]. Level shifter/driver 632 is connected to SELB[i+15].

Level shifters are standard level shifters known in the art. Each level shifter will receive a low voltage logic signal and create/output (and drive) a level shifted signal that is higher in voltage than the inputted low voltage logic signal. For example, a sense amplifier need not drive the program voltage on the global data line. Instead, a sense amplifier will only drive a logic 0 or a logic 1. In one example embodiment, logic 1 can be 3 volts and logic 0 can be 0 volts. When the circuit of FIG. 16 is operated, the level shifters 630 and 632 will receive either the logic 1 (e.g. 3 volts), or logic 0 (ground) from the D flip flop via the multiplexer circuit. Level shifters 630 or 632 will then convert 3 volts to the program voltage and convert 0 volts to the unselected bit line voltage. One example of a suitable program voltage is 8 v. One example of a suitable unselected bit line voltage is 1 v. An advantage of the latched multiplexer with driver is that there is no high voltage swing on GSELB lines. This will save transient power because capacitive loading on GSELB is much bigger than capacitive loading on SELB. Additionally, there is faster data transfer on GSELB because of lower voltage level on GSELB.

Figure 17:
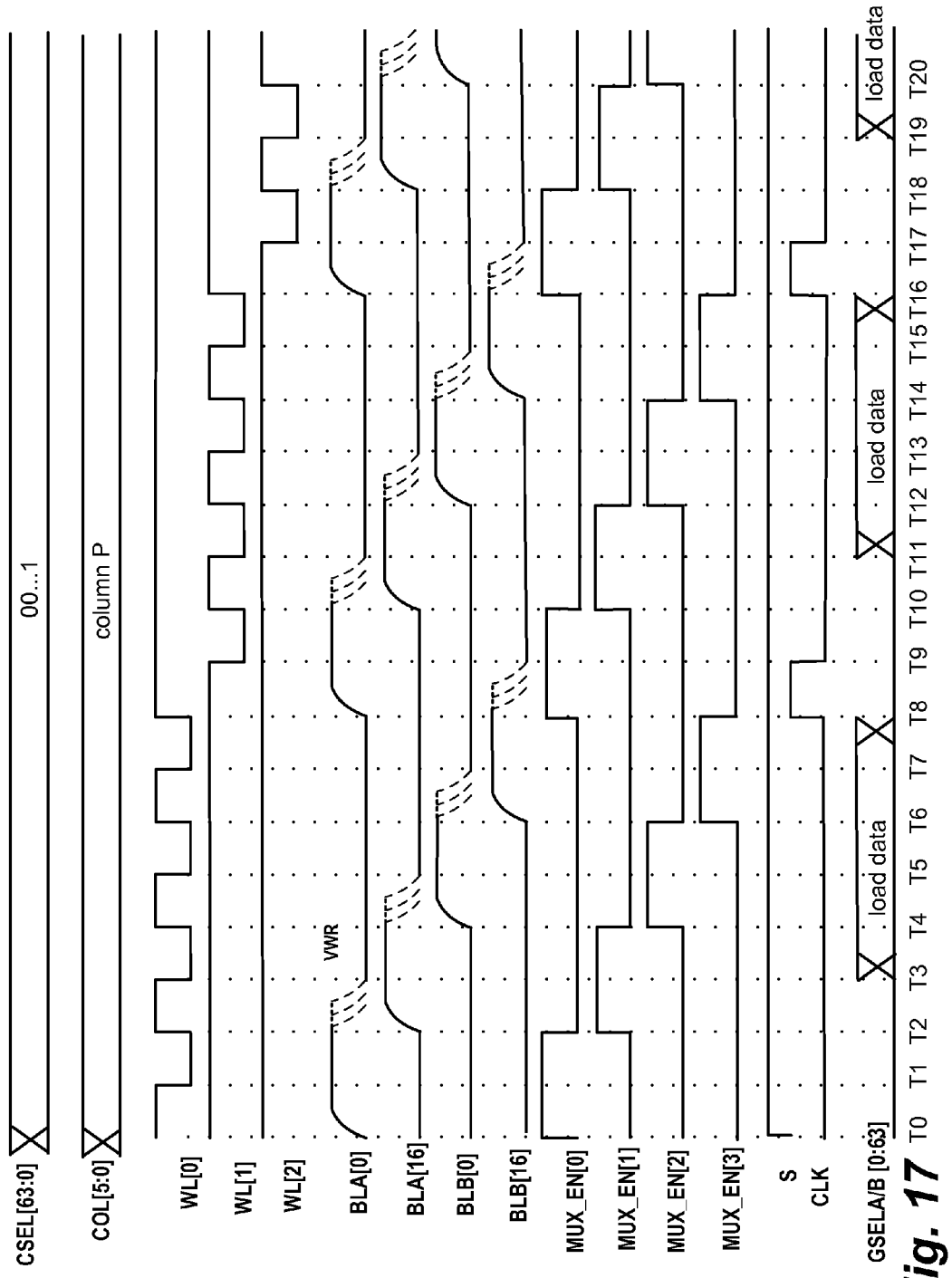
FIG. 17 is a timing diagram that explains the operation of the structure of FIG. 15.

FIG. 17 is a timing diagram describing the operation of the structure of FIGS. 15 and 16. FIG. 17 shows the behavior of the following signals: CSEL[63:0], COL[5:0], WL[0], WL[1], WL[2], BLA[0], BLA[15], BLB[0], BLB[15], MUX_EN[0], MUX_EN[1], MUX_EN[2], MUX_EN[3], S, CLK, GSELA\B[0:63]. The signal CSEL[63:0] is a 64 bit signal that uniquely turns on a column of selection circuits 300, and is depicted in FIG. 10. The signal COL[5:0] is a 6 bit column address. In the embodiment of FIG. 17, a page of data is programmed across multiple word lines without changing the column address; therefore, COL[5:0] and CSEL[63:0] do not change.

WL[0], WL[1], and WL[2] depict the word line voltages. Each word line will have a voltage pulse corresponding to providing the appropriate programming voltage for selected memory cells for each of the sense amplifier cycles. In the example discussed above, there are four sense amplifier cycles in every word line cycle. Therefore, each word line WL[0] . . . WL[15] will have four pulses. Due to spacing, FIG. 17 only shows the pulses for WL[0], WL[1] and WL[2]. The four pulses for WL[0] start at T1, T3, T5, and T7. The four pulses for WL[1] start at T9, T11, T13, and T15. FIG. 17 only shows the first two pulses for WL[2], starting at T17 and T19. FIG. 17 shows the pulses as negative pulses; however, in some embodiments, the pulses could be of opposite polarity. In forward operation, the bit line is high and the word line is low so that the bit is being programmed to 0 (e.g., RESET). In reverse operation, the bit line is low and the word line is high so that the bit is being programmed to 1 (e.g., SET). In some embodiments, if both the word line and bit line are high (or both are low), the bit will not change.

The signals BLA[0] and BLA[16] show the voltages on bit lines for side A of the block of memory cells. BLA[0] is one of the bit lines in the first sense amplifier cycle, and BLA[16] is one of the bit lines in the second sense amplifier cycle. BLB[0] and BLB[16] are two bit lines from side B of the block. The bit line BLB[0] is one of the bit lines in the third sense amplifier cycle and BLB[15] is one of the bit lines in the fourth sense amplifier cycle. In one example, bit line BLA[0] may be one of the bit lines connected to a latched multiplexor with diver 602 that receives MUX_EN[0], BLA[16] may be one of the bit lines connected to a latched multiplexor with driver 602 that receives MUX_EN[1], BLB[0] may be one of the bit lines connected to a latched multiplexor with driver 602 that receives MUX_EN[2], and BLB[15] may be one of the bit lines connected to a latched multiplexor with driver 602 that receives MUX_EN[3]. In one embodiment, BLA[0]

represents the behavior of BLA[0:15], BLA[16] represents the behavior of BLA[16:31], BLB[0] represents the behavior of BLB[0:15], and BLB[16] represents the behavior of BLB16:31].

During the appropriate sense amplifier cycle, bit line will be charged up and at some point the memory cell will become programmed (e.g. SET or RESET) and dissipate the charge through the bit line. For example, bit line BLA[0] is charged up at T0 and the memory cell will become programmed sometime between T1 and T2. After T2, WL[0] is disabled and BLA[0] is discharged. BLA[16] is charged up at T2, programmed between T3 and T4, and will dissipate that charge sometime after T4. BLB[0] will be charged up at T4, programmed between T5 and T6, and will dissipate that charge sometime after T6. BLB[16] will be charged up at T6, programmed between T7 and T8, and will dissipate its charge sometime after T8. The above discussed charging and discharging are for the word line cycle associated with WL[0]. This will be repeated for the next word line cycle for WL[1] starting at BLA[0] being charged up at T8, programmed between T9 and T10, and discharged at or after T10. BLA[16] is charged up at T10, programmed between T11 and T12, and discharged at or after T12. BLB[0] being charged up at T12, programmed between T13 and T14, and discharged at or after T14. BLB[15] is charged up at T14, programmed between T15 and T16, and discharged at or after T16. The third word line cycle will start at T16 with BLA[0] charged up at T16 and BLA[15] being charged up at T18.

As can be seen from FIG. 17, MUX_EN[0] is high from T0 to T2, MUX_EN[1] is high from T2 to T4, MUX_EN[2] is high from T4 to T6, MUX_EN[3] is high from T6 to T8, all to effectuate the first word line cycle. The second word line cycle includes MUX_EN[0] being high from T8 to T10, MUX_EN[1] being high from T10 to T12, MUX_EN[2] being high from T12 to T14, and MUX_EN[3] being high from T14 to T16. The signal S (see FIG. 16) is high during the entire period depicted in FIG. 17. The signal CLK is used to clock in new data for a new word line cycle into the appropriate D flip flops 620. Therefore, CLK will go high at T8 to clock in data for the second word line cycle and go high again at T16 to clock in data for the third word line cycle. In order to have the data loaded and ready for insert loading into the D flip flop, data is loaded for the second word line cycle starting at T3 to T8. Data is loaded for the third word line cycle from T11 to T16. Data is loaded for the fourth word line cycle at T19.

In the embodiment discussed above with respect to FIGS. 15-17, the loading and programming of data is pipelined. Data for a particular word line cycle is loaded during the previous word line cycle and then remains latched during the entire current word line cycle so that all sense amplifier cycles will use the same data without having to reload data. This reduces the time for programming.

One embodiment includes a monolithic three dimensional array of non-volatile storage elements arranged in blocks of non-volatile storage elements, a plurality of word lines connected to the non-volatile storage elements such that each block of non-volatile storage elements includes a set of the word lines, a plurality of bit lines connected to the non-volatile storage elements such that the bit lines are grouped into columns and each block has multiple columns of bit lines, row decoders connected to the word lines where the row decoders are positioned underneath the array of non-volatile storage elements, one or more signal sources, selection circuitry for selecting bit lines to be in communication with the one or more signal sources, column decoders in communication with and controlling the selection circuits such that the column decoders are arranged outside the array of non-volatile storage elements and each column decoder selects corresponding columns of bit lines for multiple blocks of non-volatile storage elements, and a control circuit in communication with the row decoders and column decoders to store one page of data across multiple word lines and within one column of bit lines for a block by selecting one column of bit lines of the block using the column decoders and programming non-volatile storage elements connected to bit lines of the selected column and multiple word lines while maintaining the selection of the one column.

One embodiment includes a monolithic three dimensional array of non-volatile storage elements arranged in stripes along a direction of rows of non-volatile storage elements such that each stripe includes multiple rows and each stripe includes multiple blocks of the non-volatile storage elements, a plurality of word lines connected to rows of the non-volatile storage elements, a plurality of bit lines connected to the non-volatile storage elements such that the bit lines are grouped into columns and each block has multiple columns of bit lines, row decoders connected to the word lines such that the row decoders are positioned underneath the array of non-volatile storage elements, data lines, sense amplifiers in communication with the data lines, selection circuits in communication with the bit lines and data lines for selectively connecting bit lines to data lines, multi-block column decoders in communication with and controlling the selection circuits such that the multi-block column decoders are arranged outside the array of non-volatile storage elements and each multi-block column decoder selects corresponding columns of bit lines for multiple blocks in one stripe, and a control circuit in communication with the row decoders and the multi-block column decoders to store one page of data across multiple word lines and within one column of bit lines by selecting one column of bit lines using the multi-block column decoders and programming non-volatile storage elements connected to the bit lines of the selected column and multiple word lines while maintaining the selection of the one column.

One embodiment includes method for programming non-volatile storage that comprises selecting a subset of one or more blocks of non-volatile storage elements (where each of the blocks of non-volatile storage elements includes columns of bit lines and sets of word lines), selecting a column of bits lines in each of the selected one or more blocks such that, the selecting a column of bits lines includes using a global column selector that selects corresponding columns of bit lines in one of the selected blocks and in unselected blocks, and programming non-volatile storage elements in the one or more selected blocks that are connected to bit lines of the selected column and multiple word lines while maintaining the selection of the column of bits lines in each of the selected blocks.

One embodiment includes a monolithic three dimensional array of non-volatile storage elements, a plurality of a first type of control lines in communication with the non-volatile storage elements, a plurality of a second type of control lines in communication with the non-volatile storage elements, a plurality of signal sources, and a plurality of a first selection circuits in communication with the signal sources and the first type of control lines. Each of the first selection circuits includes a storage device, a select circuit connected to the storage device and one or more level shifters providing two or more interfaces to the respective first selection circuit.

One embodiment includes a monolithic three dimensional array of non-volatile storage elements. The array of non-volatile storage elements is arranged in stripes along a direction of rows of non-volatile storage elements such that each stripe includes multiple rows. Each stripe includes multiple blocks of the non-volatile storage elements. The system further includes a plurality of word lines connected to rows of the non-volatile storage elements, a plurality of bit lines connected to the non-volatile storage elements such that the bit lines are grouped into columns and each block has multiple columns of bit lines, row decoders connected to the word lines such that the row decoders are positioned underneath the array of non-volatile storage elements, global data lines, sense amplifiers connected to the global data lines, local data lines, first selection circuits such that each of the first selection circuits includes a storage device and a select circuit connected to the storage device and one or more level shifters connected to two or more local data lines, second selection circuits connected to the bit lines and local data lines for selectively connecting columns of bit lines to the local data lines, and column decoders connected to and controlling the second selection circuits. The column decoders are arranged outside the array of non-volatile storage elements, each column decoder selects corresponding columns of bit lines for multiple blocks in one stripe.

One embodiment includes method for programming non-volatile storage that comprises driving first low voltage logic signals on a first set of data lines, storing the first low voltage logic signals from the first set of data lines, selecting a subset of a second set of data lines, level shifting the stored first low voltage logic signals to create level shifted signals that are higher in voltage than the stored first low voltage logic signals, and driving the level shifted signals on the selected subset of the second set of data lines to program a selected subset of non-volatile storage elements.

The foregoing detailed description has been presented for purposes of illustration and description. It is not intended to be exhaustive or to limit the invention to the precise form disclosed. Many modifications and variations are possible in light of the above teaching. The described embodiments were chosen in order to best explain the principles of the invention and its practical application to thereby enable others skilled in the art to best utilize the invention in various embodiments and with various modifications as are suited to the particular use contemplated. It is intended that the scope of the invention be defined by the claims appended hereto.

What is claimed is:

1. A non-volatile storage apparatus, comprising:
a monolithic three dimensional array of non-volatile storage elements arranged in blocks of non-volatile storage elements;
a plurality of word lines connected to the non-volatile storage elements, each block of non-volatile storage elements includes a set of the word lines;
a plurality of bit lines connected to the non-volatile storage elements, the bit lines are grouped into columns, each block has multiple columns of bit lines;
row decoders connected to the word lines, the row decoders are positioned underneath the array of non-volatile storage elements;
one or more signal sources;
selection circuitry for selecting bit lines to be in communication with the one or more signal sources;
column decoders in communication with and controlling the selection circuits, the column decoders are arranged outside the array of non-volatile storage elements, each column decoder selects corresponding columns of bit lines for multiple blocks of non-volatile storage elements; and
a control circuit in communication with the row decoders and column decoders to store one page of data across multiple word lines and within one column of bit lines for a block by selecting one column of bit lines of the block using the column decoders and programming non-volatile storage elements connected to bit lines of the selected column and multiple word lines while maintaining the selection of the one column.

2. The non-volatile storage apparatus of claim 1, wherein:
the control circuit causes one page of data to be stored across multiple word lines and within one column of bit lines for a block by connecting only one column of bit lines in the block to the signal sources.

3. The non-volatile storage apparatus of claim 1, wherein:
each column decoder selects one column of bit lines for each of multiple blocks.

4. The non-volatile storage apparatus of claim 1, wherein:
the control circuit causes one page of data to be stored across multiple word lines without changing a column address for the array of non-volatile storage elements.

5. The non-volatile storage apparatus of claim 1, wherein:
the control circuit causes one page of data to be stored across multiple word lines by performing multiple word lines cycles for a single column address and performing multiple sense amplifier cycles for each word line cycle; and
each sense amplifier cycle programs a subset of non-volatile storage elements selected for programming that are connected to a selected word line.

6. The non-volatile storage apparatus of claim 1, wherein:
the control circuit causes one page of data to be stored across multiple word lines by simultaneously programming multiple non-volatile storage elements connected to different word lines and within the one column of bit lines.

7. The non-volatile storage apparatus of claim 1, wherein:
the control circuit causes a common data value to be stored across multiple word lines by simultaneously programming all of non-volatile storage elements connected to different word lines and at least a subset of bit lines of the one column of bit lines.

8. The non-volatile storage apparatus of claim 1, wherein:
the non-volatile storage elements each include a reversible resistance-switching element; and
the control circuit causes one page of data to be stored across multiple word lines by changing resistance of the reversible resistance-switching element for at least a subset of the non-volatile storage elements.

9. The non-volatile storage apparatus of claim 8, wherein:
the monolithic three dimensional array of non-volatile storage elements is a cross point array; and
the non-volatile storage elements each include a steering device connected to the respective resistance-switching element.

10. A non-volatile storage apparatus, comprising:
a monolithic three dimensional array of non-volatile storage elements, the array of non-volatile storage elements is arranged in stripes along a direction of rows of non-volatile storage elements such that each stripe includes multiple rows, each stripe includes multiple blocks of the non-volatile storage elements;
a plurality of word lines connected to rows of the non-volatile storage elements;
a plurality of bit lines connected to the non-volatile storage elements, the bit lines are grouped into columns, each block has multiple columns of bit lines;

row decoders connected to the word lines, the row decoders are positioned underneath the array of non-volatile storage elements;

data lines;

sense amplifiers in communication with the data lines;

selection circuits in communication with the bit lines and data lines for selectively connecting bit lines to data lines;

multi-block column decoders in communication with and controlling the selection circuits, the multi-block column decoders are arranged outside the array of non-volatile storage elements, each multi-block column decoder selects corresponding columns of bit lines for multiple blocks in one stripe; and a control circuit in communication with the row decoders and the multi-block column decoders to store one page of data across multiple word lines and within one column of bit lines by selecting one column of bit lines using the multi-block column decoders and programming non-volatile storage elements connected to the bit lines of the selected column and multiple word lines while maintaining the selection of the one column.

11. The non-volatile storage apparatus of claim 10, wherein the programming of the non-volatile storage elements connected to the bit lines of the selected one column and multiple word lines while maintaining the selection of the one column includes:

programming non-volatile storage elements connected to the same bit line and different word lines without programming non-volatile storage elements in other column of a selected block that include the one column.

12. The non-volatile storage apparatus of claim 10, wherein the programming of the non-volatile storage elements connected to the bit lines of the selected column and multiple word lines while maintaining the selection of the one column includes:

simultaneously programming non-volatile storage elements connected to the same bit line and different word lines without changing the selection of the one column.

13. The non-volatile storage apparatus of claim 10, further comprising:

additional selection circuits, the data lines includes local data lines and global data lines, the additional selection circuits are in contact with the local data lines and global data lines to put a subset of local data lines in communication with the global data lines, the control circuit causes one page of data to be stored across multiple word lines by performing multiple word lines cycles for a single column address and multiple sense amplifier cycles for each word line cycle, each sense amplifier cycle is performed by using the additional selection circuits to choose a different subset of local data lines to be in communication with the global data lines.

14. The non-volatile storage apparatus of claim 10, wherein:

the multi-block column decoders include a first set of multi-block column decoders on a first side of a first stripe and a second set of multi-block column decoders on a second side of the first stripe;

the plurality of bit lines include a first set of bit lines on the first side of the first stripe and a second set of bit lines on a second side of the first stripe;

the first set of multi-block column decoders control the first set of bit lines;

the second set of multi-block column decoders control the second set of bit lines; and the first set of bit lines and the second set of bit lines connect to the same set of word lines and store data in the one page across the same set of word lines.

15. The non-volatile storage apparatus of claim 10, wherein:

the monolithic three dimensional array of non-volatile storage elements is a cross point array;

the non-volatile storage elements each include a reversible resistance-switching element and a steering device; and the control circuit causes one page of data to be stored across multiple word lines by changing resistance of the reversible resistance-switching element for at least a subset of the non-volatile storage elements.

16. The non-volatile storage apparatus of claim 10, further comprising:

a substrate, the monolithic three dimensional array of non-volatile storage elements is positioned above the substrate, the row decoders are positioned underneath the array of non-volatile storage elements and on the substrate, the multi-block column decoders are arranged outside the array of non-volatile storage elements and on the substrate.

17. A method for programming non-volatile storage, comprising:

selecting a subset of one or more blocks of non-volatile storage elements, each of the blocks of non-volatile storage elements includes columns of bit lines and sets of word lines;

selecting a column of bit lines in each of the selected one or more blocks, the selecting a column of bit lines includes using a global column selector that selects corresponding columns of bit lines in one of the selected blocks and in unselected blocks; and programming non-volatile storage elements in the one or more selected blocks that are connected to bit lines of the selected column and multiple word lines while maintaining the selection of the column of bits lines in each of the selected blocks.

18. The method of claim 17, wherein:

the programming of non-volatile storage elements connected to bit lines of the selected column and multiple word lines comprises simultaneously programming non-volatile storage elements connected to the same bit line and different word lines without changing the selection of the column of bits lines.

19. The method of claim 17, wherein:

the non-volatile storage elements each include a reversible resistance-switching element and a steering device; and the programming non-volatile storage elements connected to bit lines of the selected column and multiple word lines comprises changing resistance of the reversible resistance-switching element for at least a subset of the non-volatile storage elements.

20. The method of claim 17, wherein the programming non-volatile storage elements connected to bit lines of the selected column and multiple word lines comprises:

performing multiple word lines cycles for a single column address; and performing multiple sense amplifier cycles for each word line cycle, each sense amplifier cycle programs a subset of non-volatile storage elements selected for programming, the subset of non-volatile storage elements include non-volatile storage elements connected to a common word line but different bit lines.

* * * * *